United States Patent
Yoichi

(10) Patent No.: US 7,227,486 B2
(45) Date of Patent: Jun. 5, 2007

(54) SWITCHED CAPACITOR CIRCUIT TYPE DIGITAL/ANALOG CONVERTER CAPABLE OF SUPPRESSING CHANGE OF SETTING ERROR

(75) Inventor: Koji Yoichi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/316,864

(22) Filed: Dec. 27, 2005

(65) Prior Publication Data

US 2006/0139196 A1    Jun. 29, 2006

(30) Foreign Application Priority Data

Dec. 28, 2004    (JP)    ............................. 2004-379054

(51) Int. Cl.
*H03M 1/66*    (2006.01)
(52) U.S. Cl. ........................................ 341/150; 341/144
(58) Field of Classification Search ................ 341/118, 341/120, 144, 150, 143
See application file for complete search history.

(56) References Cited

U.S. PATENT DOCUMENTS 5,923,275 A * 7/1999 Kalb ........................... 341/150
7,102,557 B1 * 9/2006 Frith ........................... 341/150

FOREIGN PATENT DOCUMENTS

JP    09-307447    11/1997

* cited by examiner

*Primary Examiner*—Brian Young
(74) *Attorney, Agent, or Firm*—McGinn IP Law Group, PLLC

(57) ABSTRACT

In a digital/analog converter of a switched capacitor circuit type including at least one capacitor, at least one power supply terminal, and at least one output terminal, a switch circuit is adapted to carry out a charging operation upon the capacitor so that a charge is stored in the capacitor and then carry out a discharging operation upon the capacitor to discharge the charge to one of the power supply terminal and the output terminal in accordance with a digital input data signal.

19 Claims, 36 Drawing Sheets

Fig. 3 PRIOR ART

| TWO-LEVEL VALUE | TWO-LEVEL INPUT SIGNAL $S_{in2}$ | S |
|---|---|---|
| +1 | H | H |
| −1 | L | L |

Fig. 8 PRIOR ART

| FOUR-LEVEL VALUE | FOUR-LEVEL INPUT SIGNAL $S_{In4}$ | | S | D(1) | D(2) |
|---|---|---|---|---|---|
| | I(1) | I(2) | | | |
| +2 | L | H | H | H | H |
| +1 | L | L | H | H | L |
| −1 | H | L | L | H | L |
| −2 | H | H | L | H | H |

Fig. 10B PRIOR ART
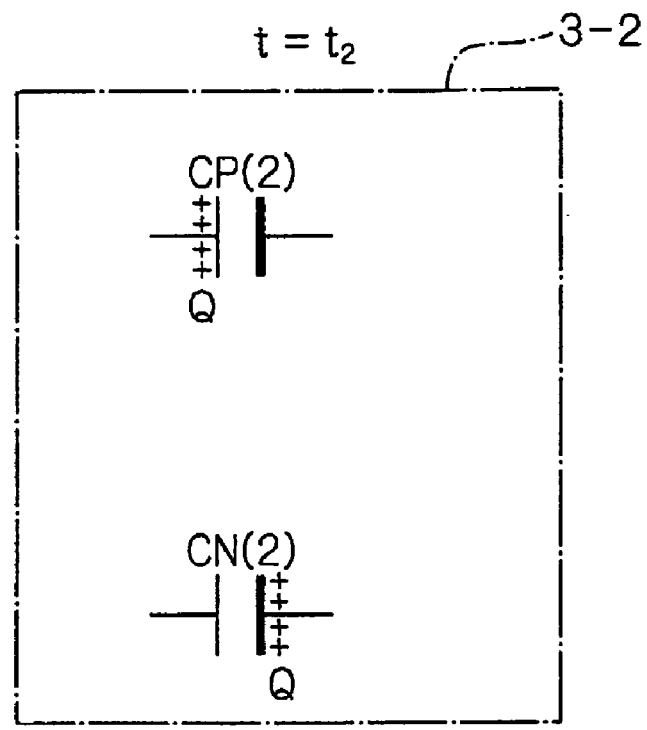
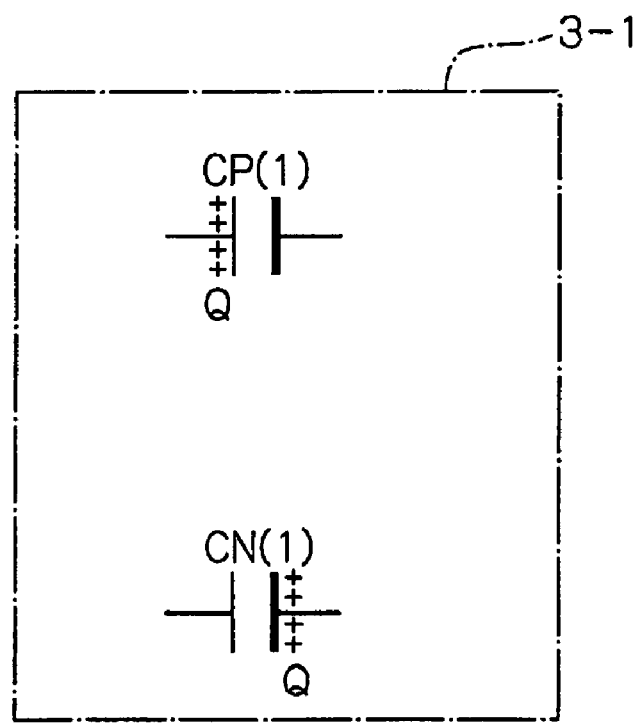

Fig. 10D PRIOR ART
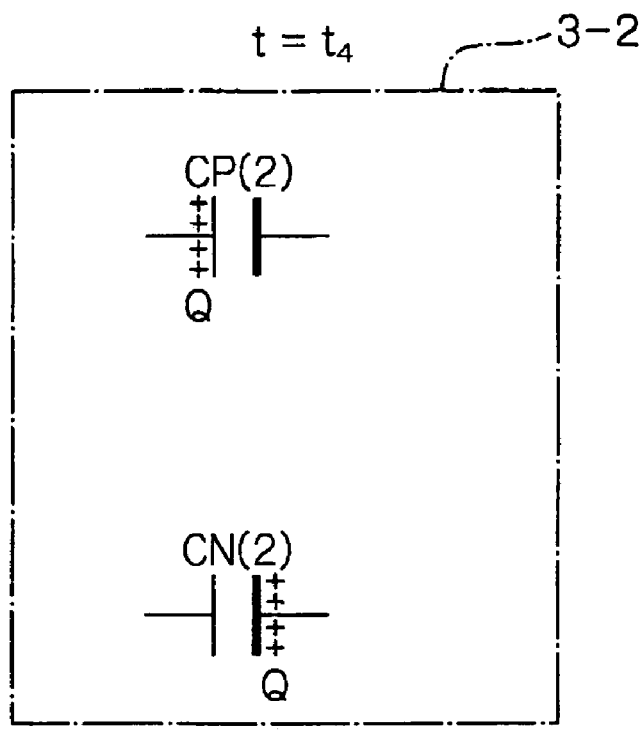
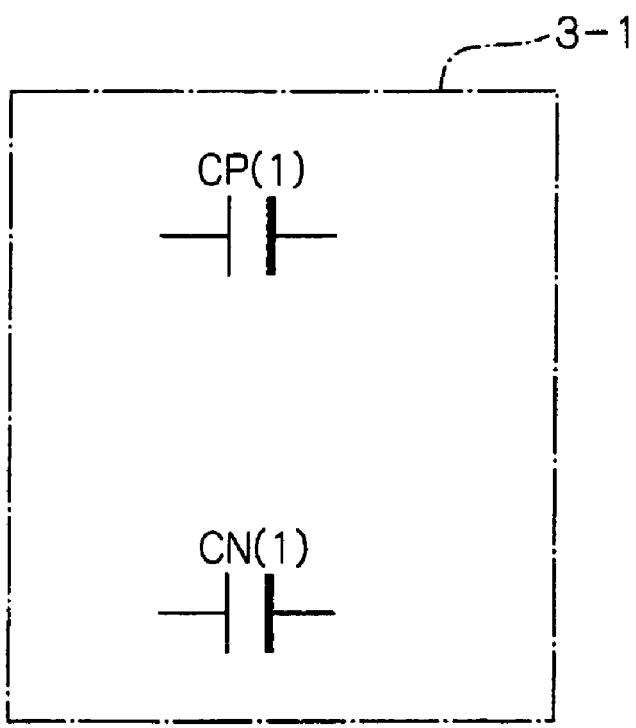

*Fig. 10F* PRIOR ART
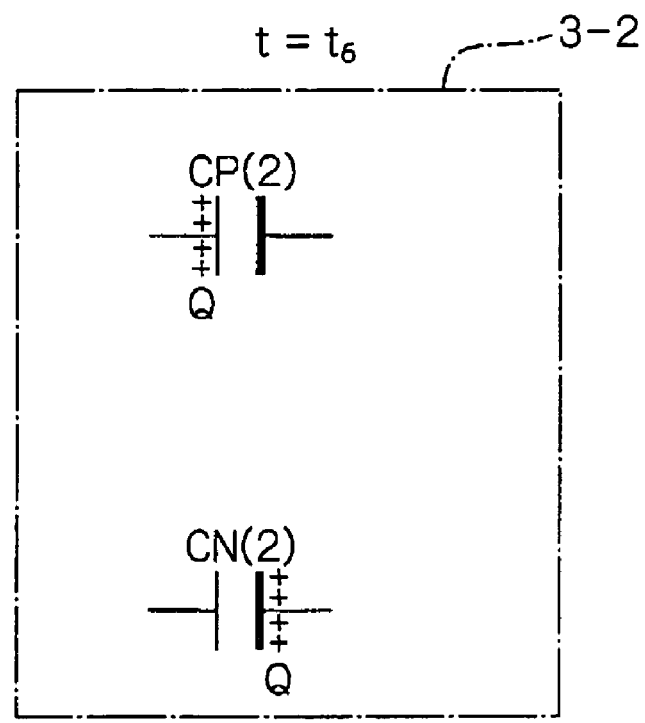
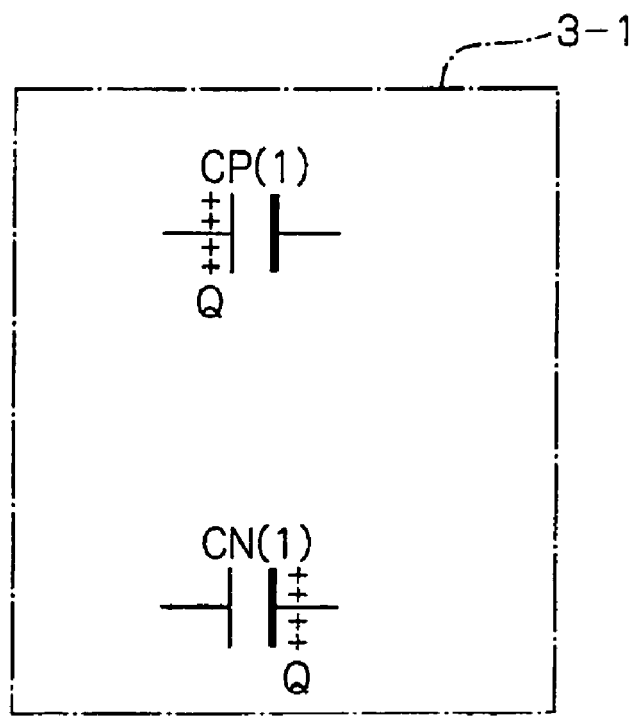

Fig. 10H  PRIOR ART
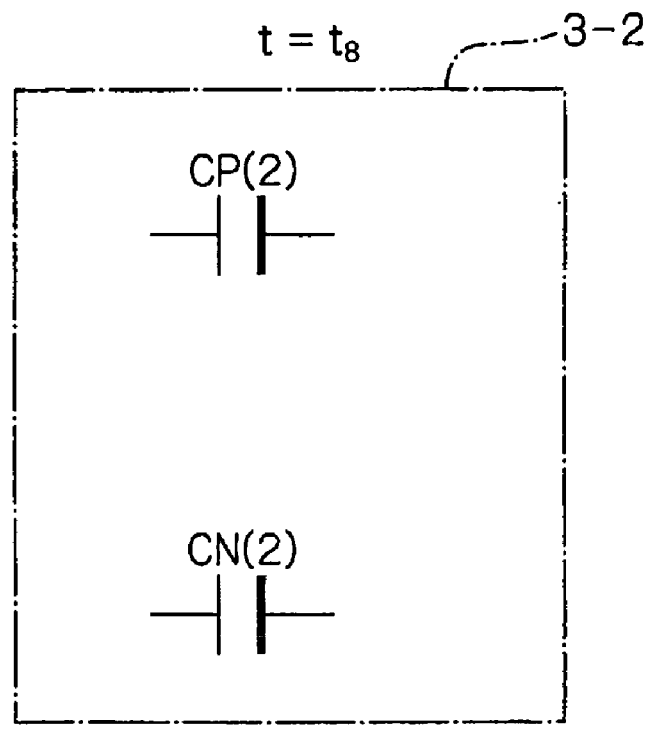
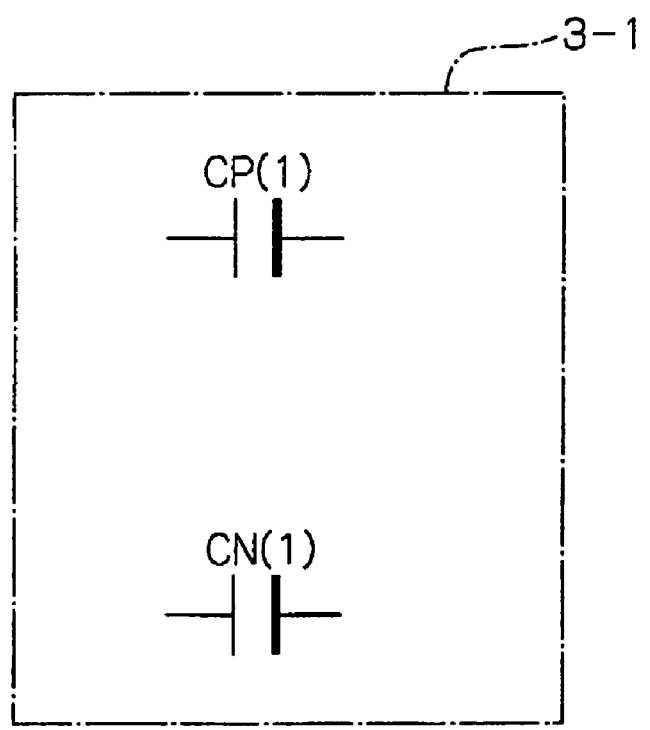

Fig. 13C
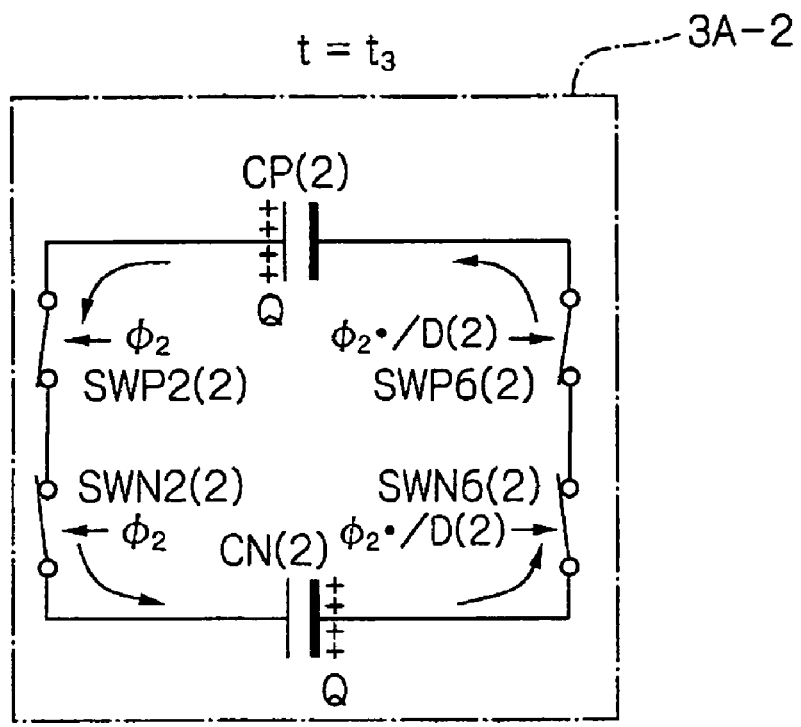
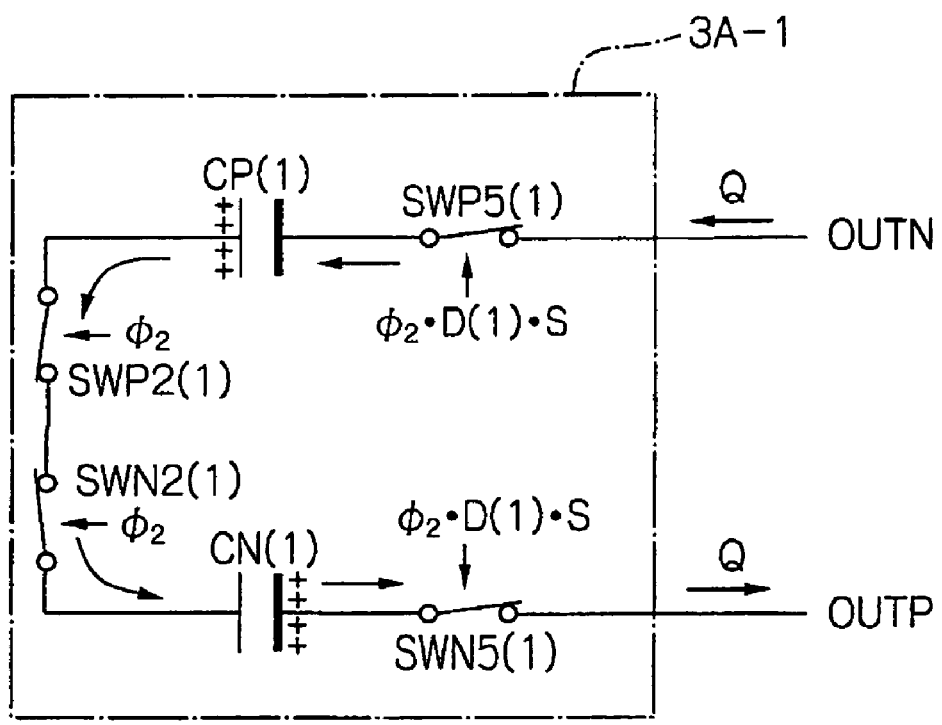

Fig. 13D
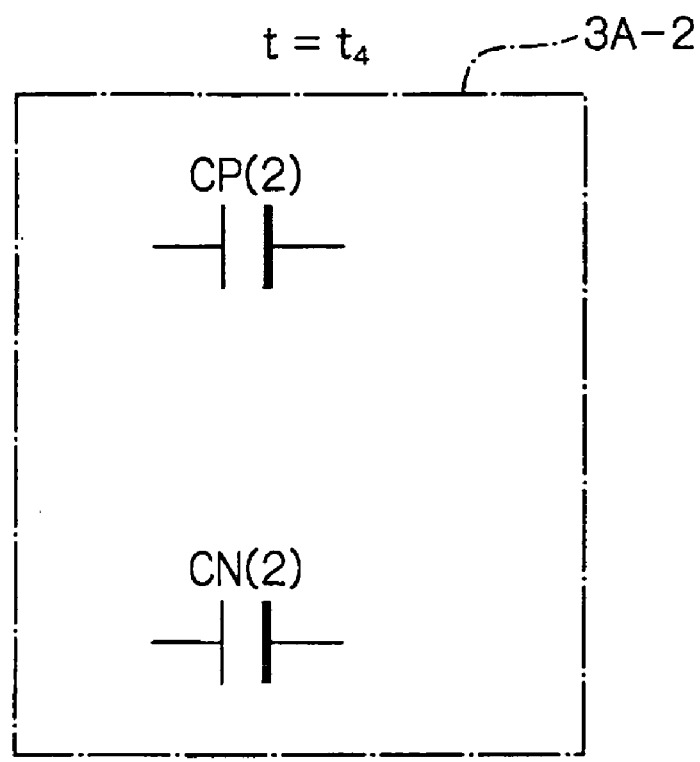
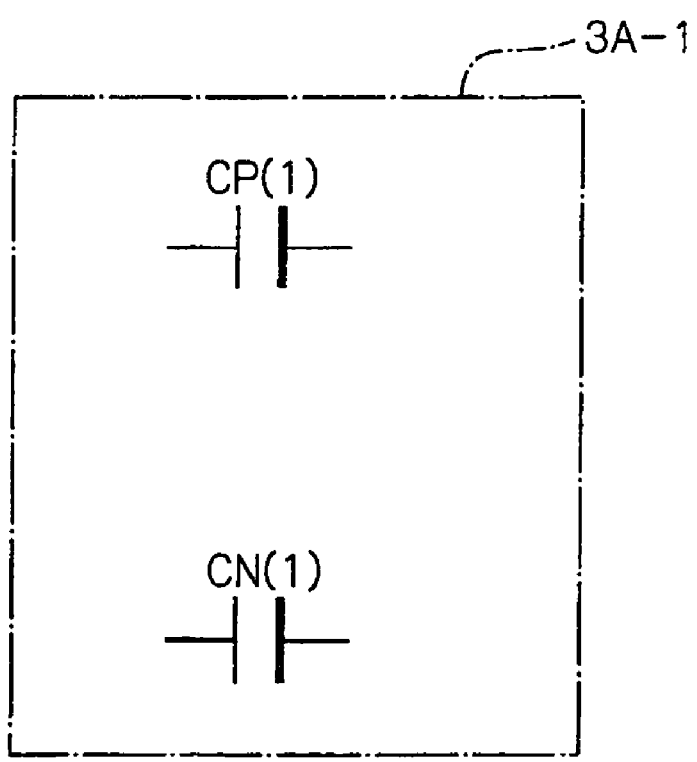

Fig. 13H
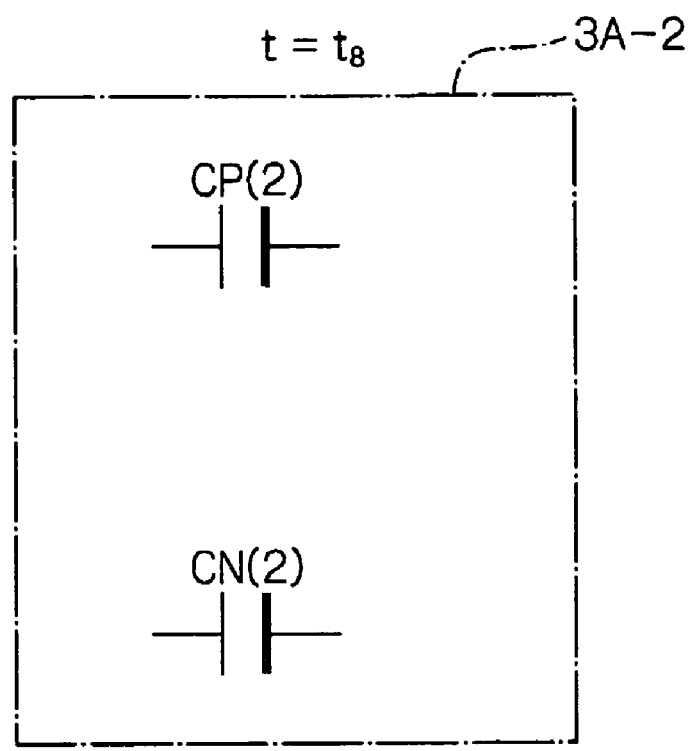
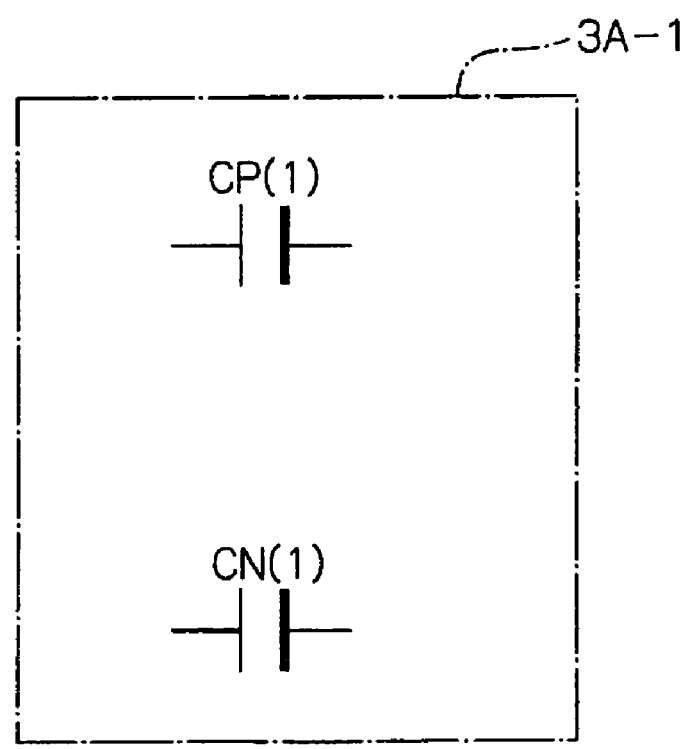

us 7,227,486 B2

SWITCHED CAPACITOR CIRCUIT TYPE DIGITAL/ANALOG CONVERTER CAPABLE OF SUPPRESSING CHANGE OF SETTING ERROR

BACKGROUND OF THE INVENTION

1. Field of the Invention

The present invention relates to a digital/analog (D/A) converter of a switched capacitor circuit type used in a multi-level D/A converter which is incorporated into a multi-bit $\Delta\Sigma$ D/A converter or a multi-bit A/D converter.

2. Description of the Related Art

In a prior art D/A converter of a switched capacitor circuit type, including at least one capacitor, at least one power supply terminal, and at least one output terminal, a switch circuit is adapted to carry out a charging operation upon the capacitor so that a charge is stored in the capacitor and then carry out a discharging operation upon the capacitor to discharge the charge to the output terminal in accordance with a digital input data signal (see: JP-9-307447-A). This will be explained later in detail.

In the above-described prior art D/A converter, if the D/A converter is incorporated into a multi-level D/A converter, even after a discharging operation is carried out, a charge in a capacitor stored during a charging operation may not be completely discharged, which would change the settling error. As a result, the total harmonic distortion (THD) characteristics and the signal-to-noise ratio (S/N) characteristics would be degraded. This also will be explained in detail later.

SUMMARY OF THE INVENTION

It is an object of the present invention to provide a switched capacitor circuit type D/A converter capable of suppressing the change of the settling error when this D/A converter is incorporated into a multi-level D/A converter.

According to the present invention, in a digital/analog converter of a switched capacitor circuit type including at least one capacitor, at least one power supply terminal, and at least one output terminal, a switch circuit is adapted to carry out a charging operation upon the capacitor so that a charge is stored in the capacitor and then carry out a discharging operation upon the capacitor to discharge the charge to one of the power supply terminal and the output terminal in accordance with a digital input data signal. As a result, after a discharging operation is carried out, a charge in a capacitor stored during a charging operation is completely be discharged, which would not change the settling error. As a result, the total harmonic distortion (THD) characteristics and the signal-to-noise ratio (S/N) characteristics would not be degraded.

BRIEF DESCRIPTION OF THE DRAWINGS

The present invention will be more clearly understood from the description set forth below, as compared with the prior art, with reference to the accompanying drawings, wherein:

FIG. 3 is a logic table showing a relationship between the two-level input signal and the sign signal S of FIG. 1;

FIG. 8 is a logic table showing a relationship between the two-level input signal and the sign signal S of FIG. 6;

FIGS. 10A through 10H are circuit diagrams for supplementing the timing diagram of FIG. 7;

FIGS. 13A through 13H are circuit diagrams for explaining the operation of the switched capacitor circuit of FIG. 11;

DESCRIPTION OF THE PREFERRED EMBODIMENTS

Before the preferred embodiments, prior art D/A converters will be explained with reference to FIGS. 1, 2, 3, 4, 5A through 5H, 6, 7, 8, 9 and 10A through 10H.

Figure 1:
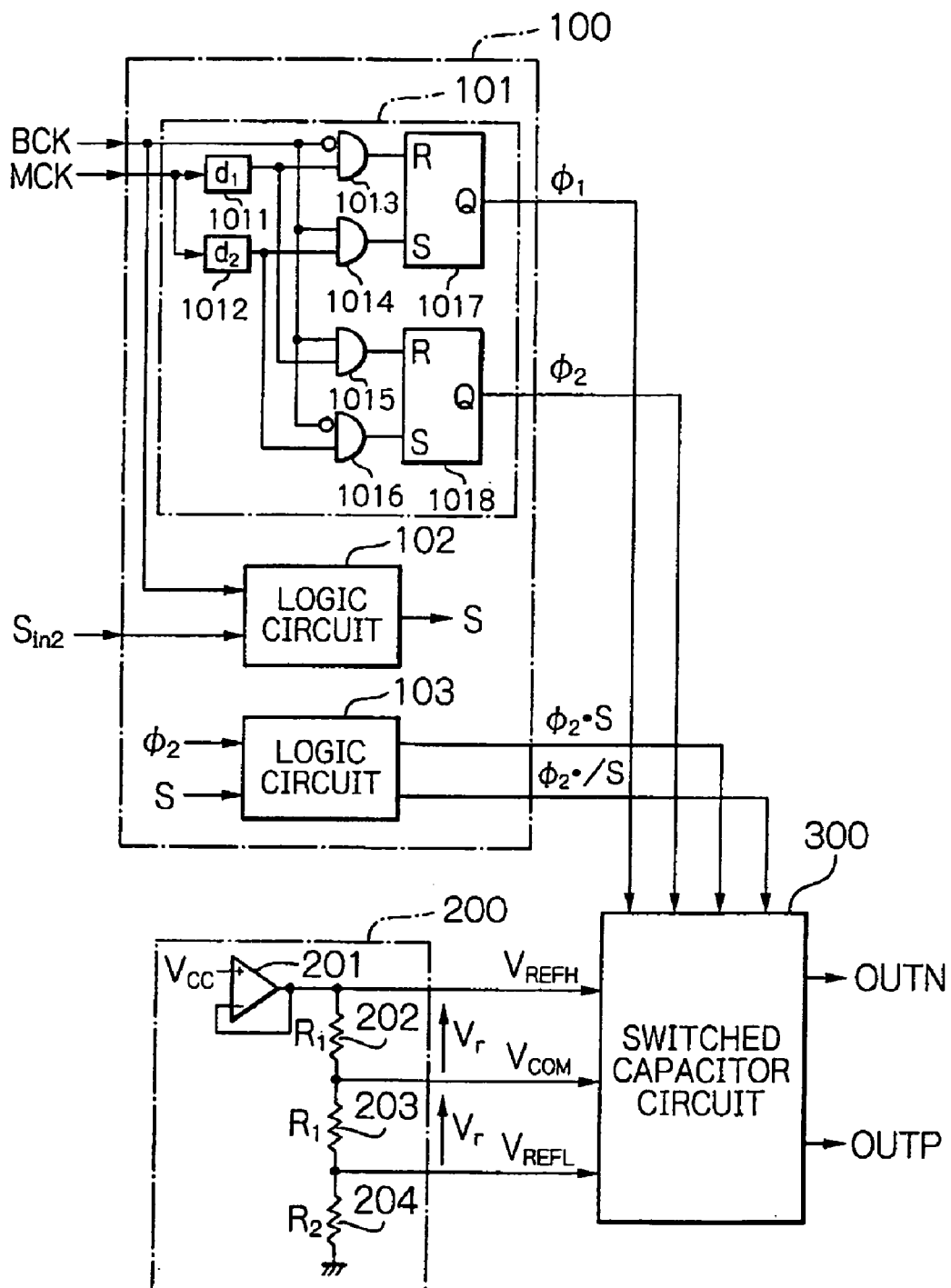
FIG. 1 is a block circuit diagram illustrating a prior art two-level (one-bit) D/A converter of a complementary type.
Figure 2:
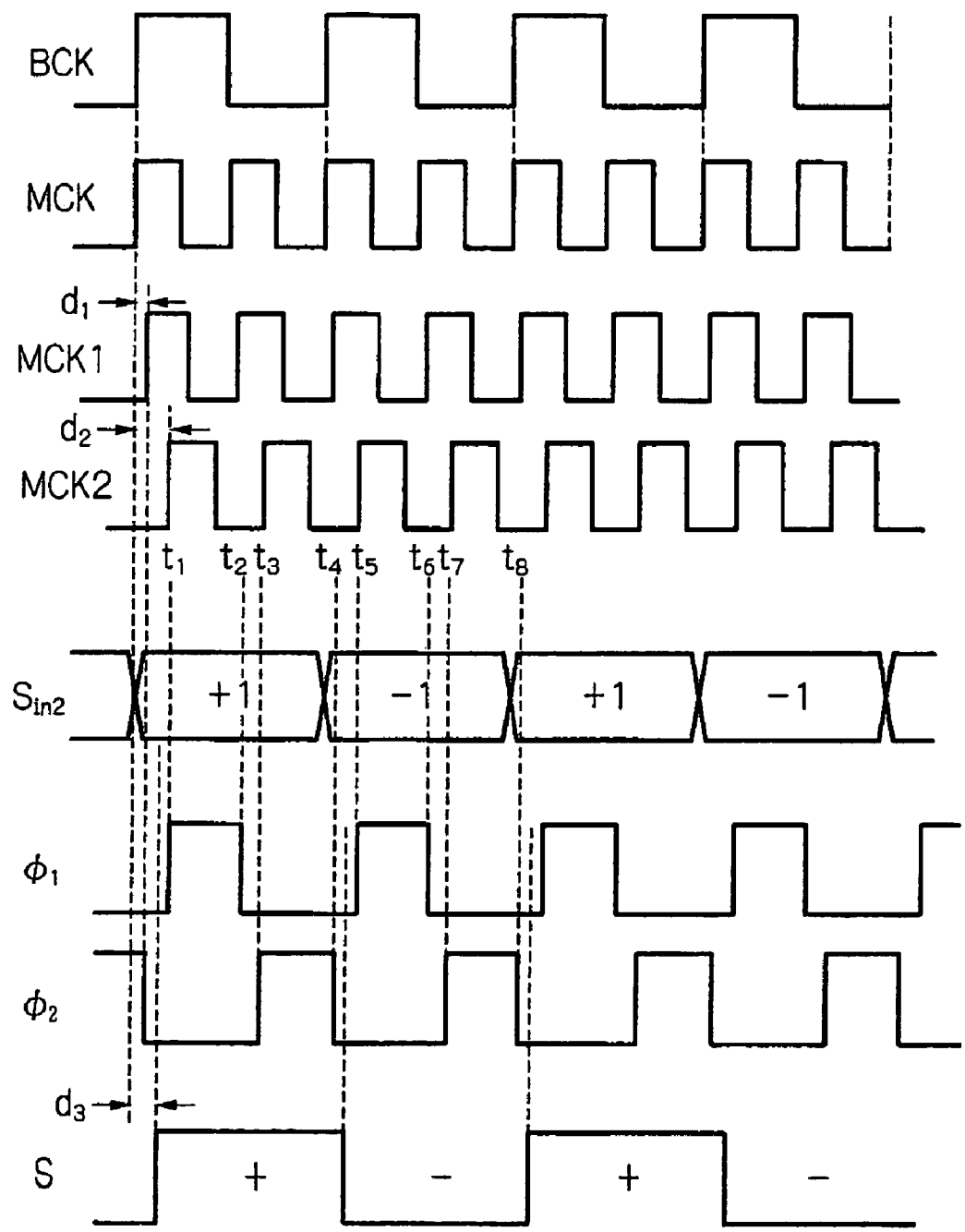
FIG. 2 is a timing diagram for explaining the operation of the switched capacitor circuit of FIG. 1.

In FIG. 1, which illustrates a prior art one-bit D/A converter of a complementary type, a clock generating circuit 100 receives a bit clock signal BCK, a master clock signal MCK and a two-level (or one-bit) digital input signal $S_{in2}$ which area in synchronization with each other. In this case, the rate of the master clock signal MCK is twice that of the bit clock signal BCK. Note that the bit clock signal BCK can be internally generated by multiplying the master clock signal MCK. As a result, the clock generating circuit 100 includes a logic circuit 101 for generating two clock signals $\phi_1$ and $\phi_2$ opposite in phase in accordance with the bit clock signal BCK and the master clock signal MCK. In more detail, the logic circuit 101 is constructed by delay circuits 1011 and 1012 having delay times $d_1$ and $d_2$ ($d_2 > d_1$) to generate delayed master clock signals MCK1 and MCK2, gate circuits 1013, 1014, 1015 and 1016, and RS-type flip-flops 1017 and 1018. As a result, as illustrated in FIG. 2, the clock signal $\phi_1$ rises in response to the rising edge of the delayed master clock signal MCK2 while the block clock signal BCK is low. Also, the clock signal $\phi_2$ rises in response to the delayed master clock signal MCK2 while the bit clock signal BLK is low and falls in response to the rising edge of the delayed clock signal MCK2 while the bit clock signal BCK is low and falls in response to the rising edge of the delayed clock signal MCK1 while the bit clock signal BCK is high. Also, the clock generating circuit 100 includes a logic circuit 102 for generating a sign signal S which shows either "H" (+) or "L" (−) in synchronization with the bit clock signal BCK. That is, as illustrated in FIG. 3, if a two-level value is defined by +1 and −1, the two-level digital input signal $S_{in2}$ is defined by on e bit data, so that the logic circuit 102 is constructed by a comparator which generates "H" or "L" in accordance with the two-level digital input signal $S_{in2}$ as illustrated in FIG. 2. In this case, the sign signal S is delayed by a delay time $d_3$ ($d_1 < d_3 < d_2$). Further, the clock generating circuit 100 includes a logic circuit 103 for generating clock signals $\phi_2 \cdot S$ and $\phi_2 \cdot /S$ in accordance with the clock signal $\phi_2$ and the sign signal S. Note that /S designates an inverted signal of S.

Also, a reference voltage generating circuit 200 generates reference voltages $V_{REFH}$, $V_{COM}$ and $V_{REFL}$. The reference voltage generating circuit 200 is constructed by a voltage buffer 201 and resistors 202, 203 and 204 having resistance values $R_1$, $R_1$ and $R_2$, respectively. Therefore, $$V_{REFH} - V_{COM} = V_{COM} - V_{REFL}$$
$$= V_r$$

The clock signals $\phi_1$, $\phi_2$, $\phi_2 \cdot S$ and $\phi_2 \cdot /S$ and the reference voltages $V_{REFH}$, $V_{COM}$ and $V_{REFL}$ are supplied to a switched capacitor circuit 300 which has complementary output terminals OUTP and OUTN.

Figure 4:
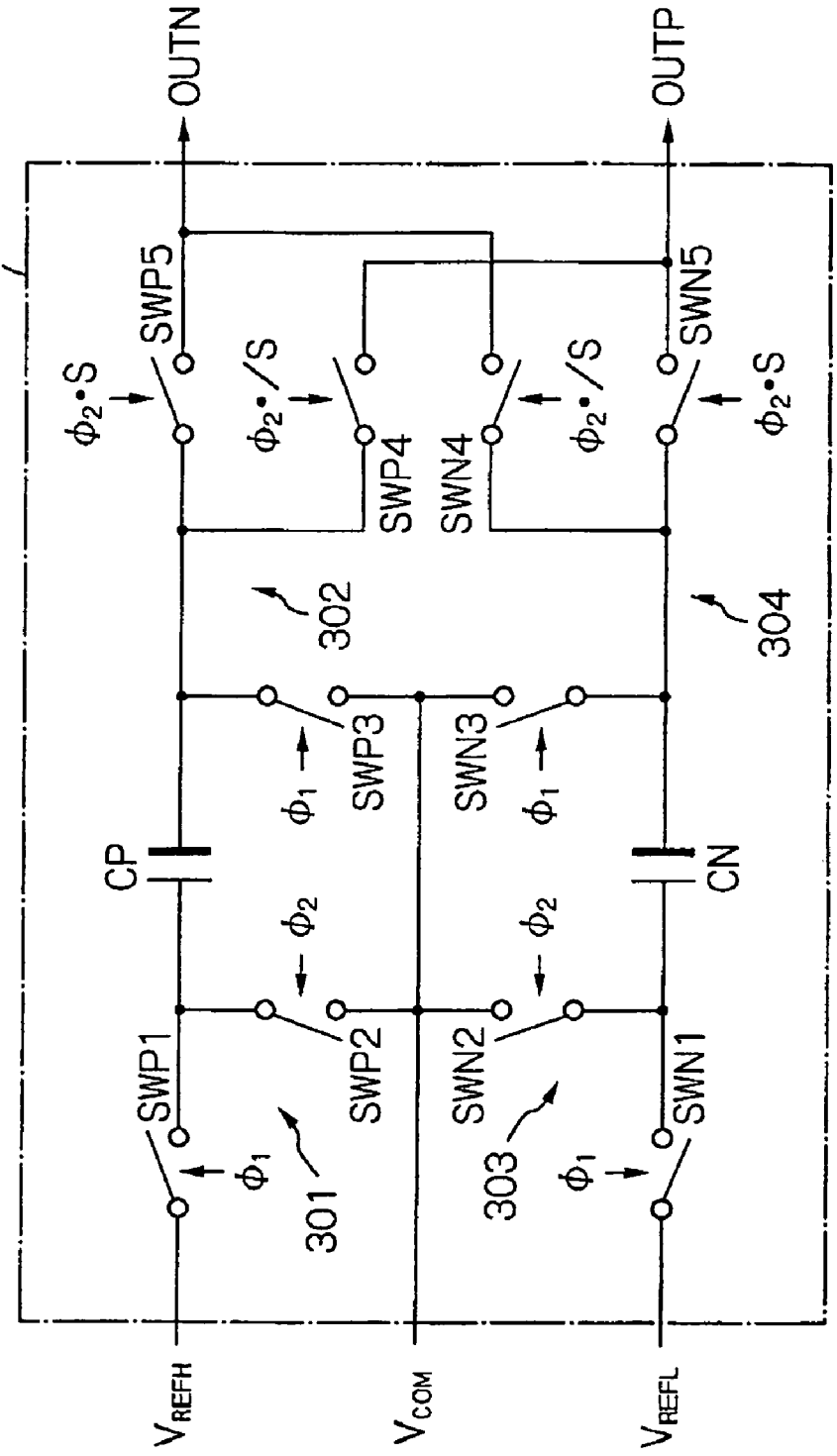
FIG. 4 is a detailed circuit diagram of the switched capacitor circuit of FIG. 1.

In FIG. 4, which is a detailed circuit diagram of the switched capacitor circuit 300 of FIG. 1, the switched capacitor circuit 300 is constructed by a switch circuit 301 formed by switches SWP1 and SWP2, a switch circuit 302 formed by switches SWP3, SWP4 and SWP5, a switch circuit 303 formed by switches SWN1 and SWN2, a switch circuit 304 formed by switches SWN3, SWN4 and SWN5, and capacitors CP and CN.

The operation of the switched capacitor circuit 300 of FIG. 4 is next explained with reference to FIGS. 5A through 5H as well as FIG. 2.

Figure 5A:
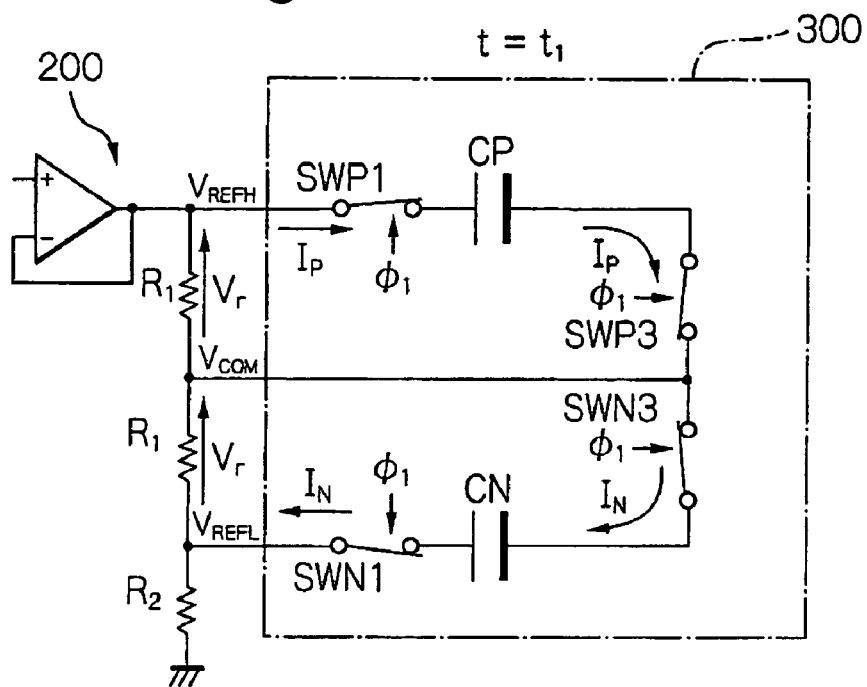
FIGS. 5A through 5H are circuit diagrams for supplementing the timing diagram of FIG. 2.

First, at time $t_1$, the clock signal $\phi_1$ rises while the clock signal $\phi_2$ remains low. As a result, as illustrated in FIG. 5A, the switches SWP1, SWP3, SWN1 and SWN3 are turned ON, so that a charging current $I_P$ is supplied to the capacitor CP and a charging current $I_N$ is supplied to the capacitor CN. In this case, note that there is no charge in the capacitors CP and CN in advance.

Figure 5B:
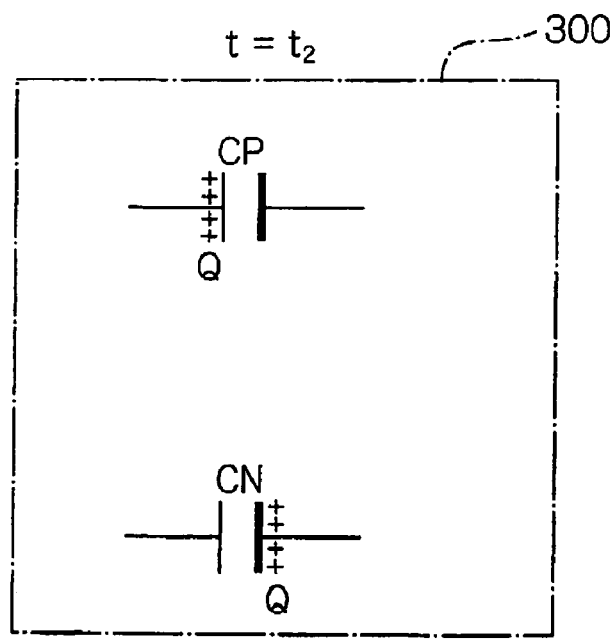

Next, at time $t_2$, the clock signal $\phi_1$ falls while the clock signal $\phi_2$ remains low. As a result, as illustrated in FIG. 5B, the capacitor CP is in a floating state with a charge of Q on the power supply side, and the capacitor CN is in a floating state with a charge of Q on the non power supply side.

Figure 5C:
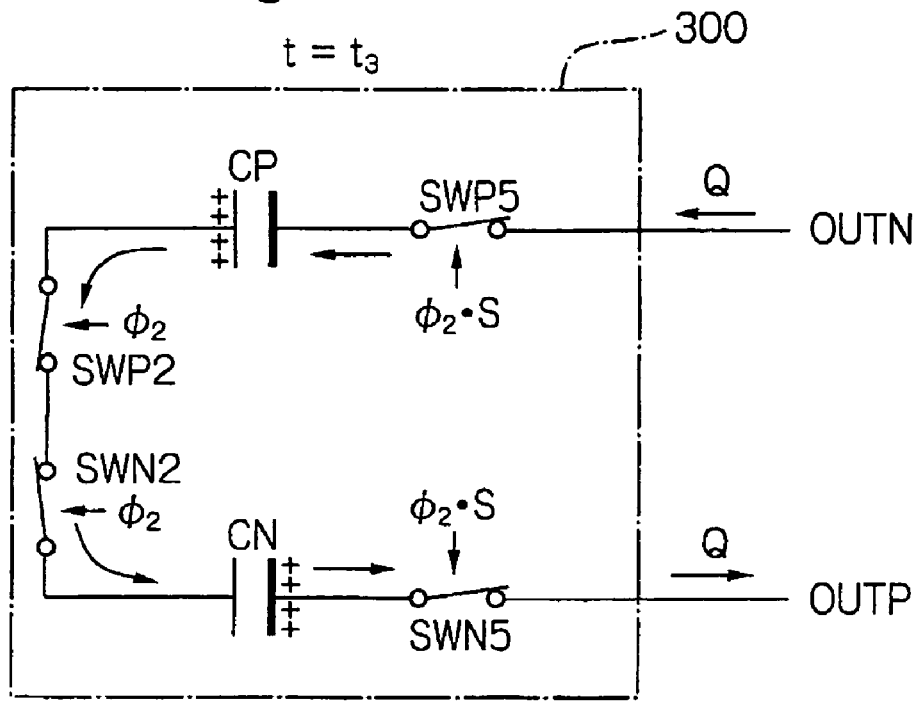

Next, at time $t_3$, the clock signal $\phi_2$ rises while the clock signal $\phi_1$ remains low. As a result, as illustrated in FIG. 5C, the switches SWP2, SWP5, SWN2 and SWN5 are turned ON, so that the charge Q is supplied from the output terminal OUTN to the capacitor CP and the charge Q is supplied from the capacitor CN to the output terminal OUTP.

Figure 5D:
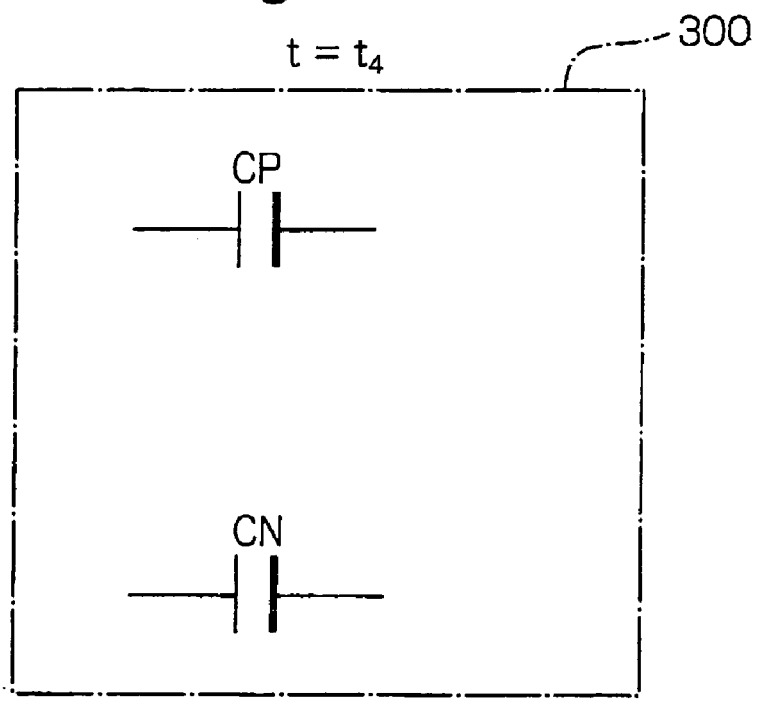

Next, at time $t_4$, the clock signal $\phi_2$ falls while the clock signal $\phi_1$ remains low. As a result, as illustrated in FIG. 5D, the capacitors CP and CN are both in a floating state with no charge.

Figure 5E:
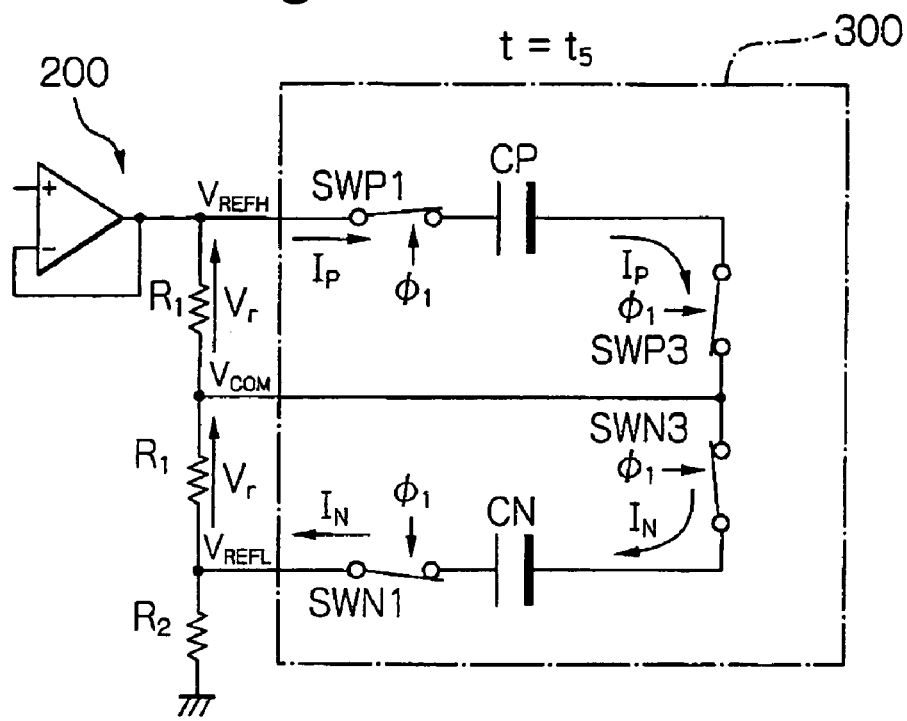

Next, at time $t_5$, the clock signal $\phi_1$ rises while the clock signal $\phi_2$ remains low. As a result, as illustrated in FIG. 5E, the switches SWP1, SWP3, SWN1 and SWN3 are turned ON, so that a charging current $I_P$ is supplied to the capacitor CP and a charging current $I_N$ is supplied to the capacitor CN. Even in this case, note that there is no charge in the capacitors CP and CN in advance. Therefore, the charging current $I_P$ is the same as that at time $t_1$, and the charging current $I_N$ is the same as that at time $t_1$.

Figure 5F:
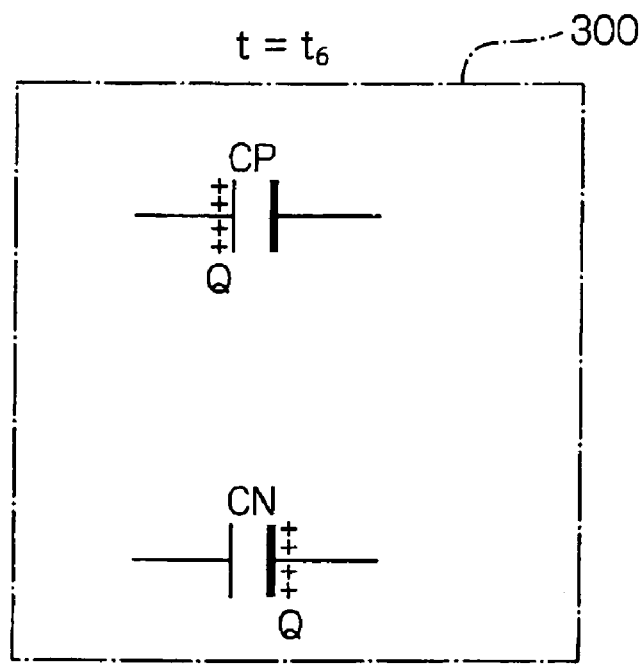

Next, at time $t_6$, the clock signal $\phi_1$ falls while the clock signal $\phi_2$ remains low. As a result, as illustrated in FIG. 5F, the capacitor CP is in a floating state with a charge of Q on the power supply side, and the capacitor CN is in a floating state with a charge of Q on the non power supply side.

Figure 5G:
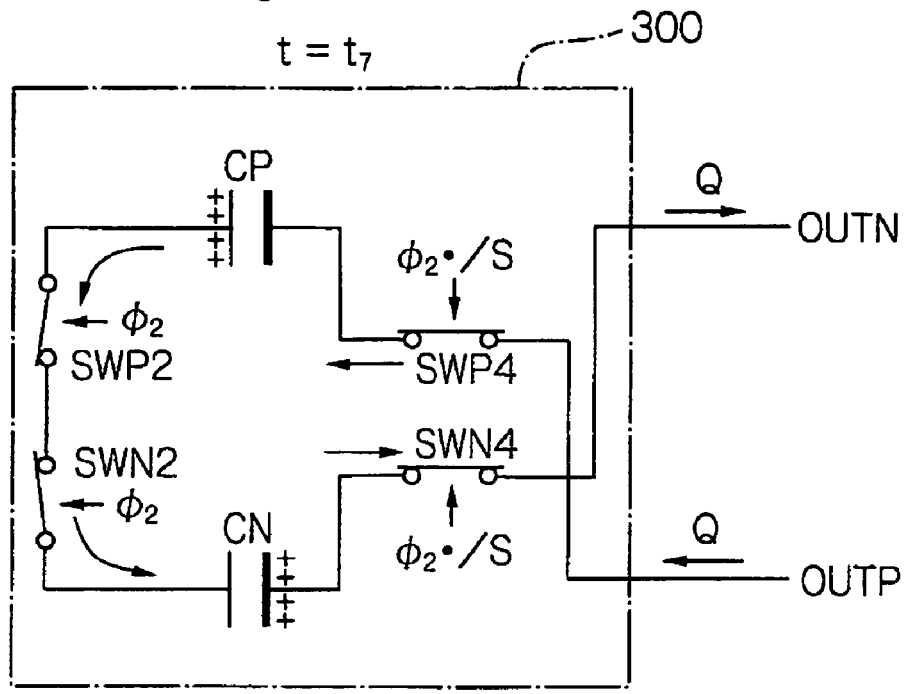

Next, at time $t_7$, the clock signal $\phi_2$ rises while the clock signal $\phi_1$ remains low. As a result, as illustrated in FIG. 5G, the switches SWP2, SWP4, SWN2 and SWN4 are turned ON, so that the charge Q is supplied from the output terminal OUTP to the capacitor CP and the charge Q is supplied from the capacitor CN to the output terminal OUTN.

Figure 5H:
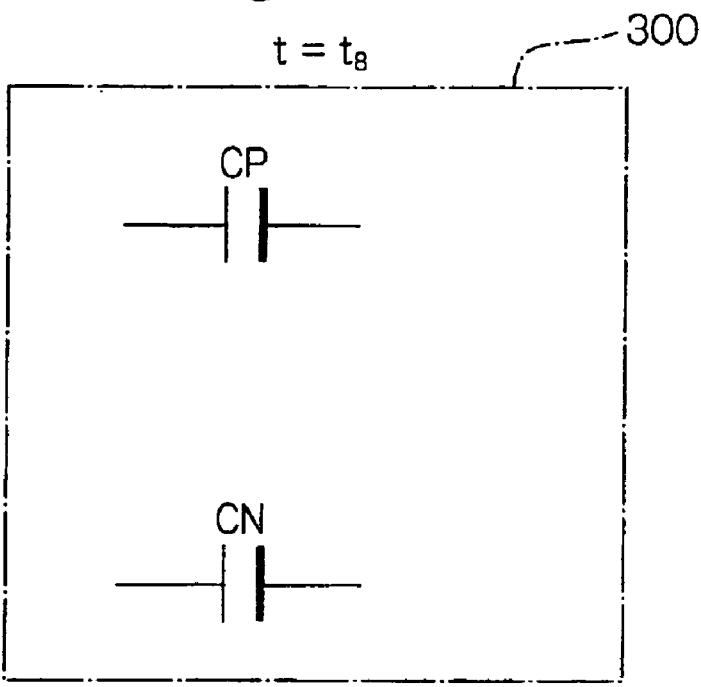

Finally, at time $t_8$, the clock signal $\phi_2$ falls while the clock signal $\phi_1$ remains low. As a result, as illustrated in FIG. 5H, the capacitors CP and CN are both in a floating state with no charge.

Thus, the charging currents $I_P$ and $I_N$ at time $t_1$ are the same as those at time $t_5$. In other words, the charging currents $I_P$ and $I_N$ are definite regardless of the sign signal S, so that the load of the reference voltage generating circuit 200 is definite regardless of the sign signal S. Therefore, the settling error is not dependent upon the sign signal S.

Figure 6:
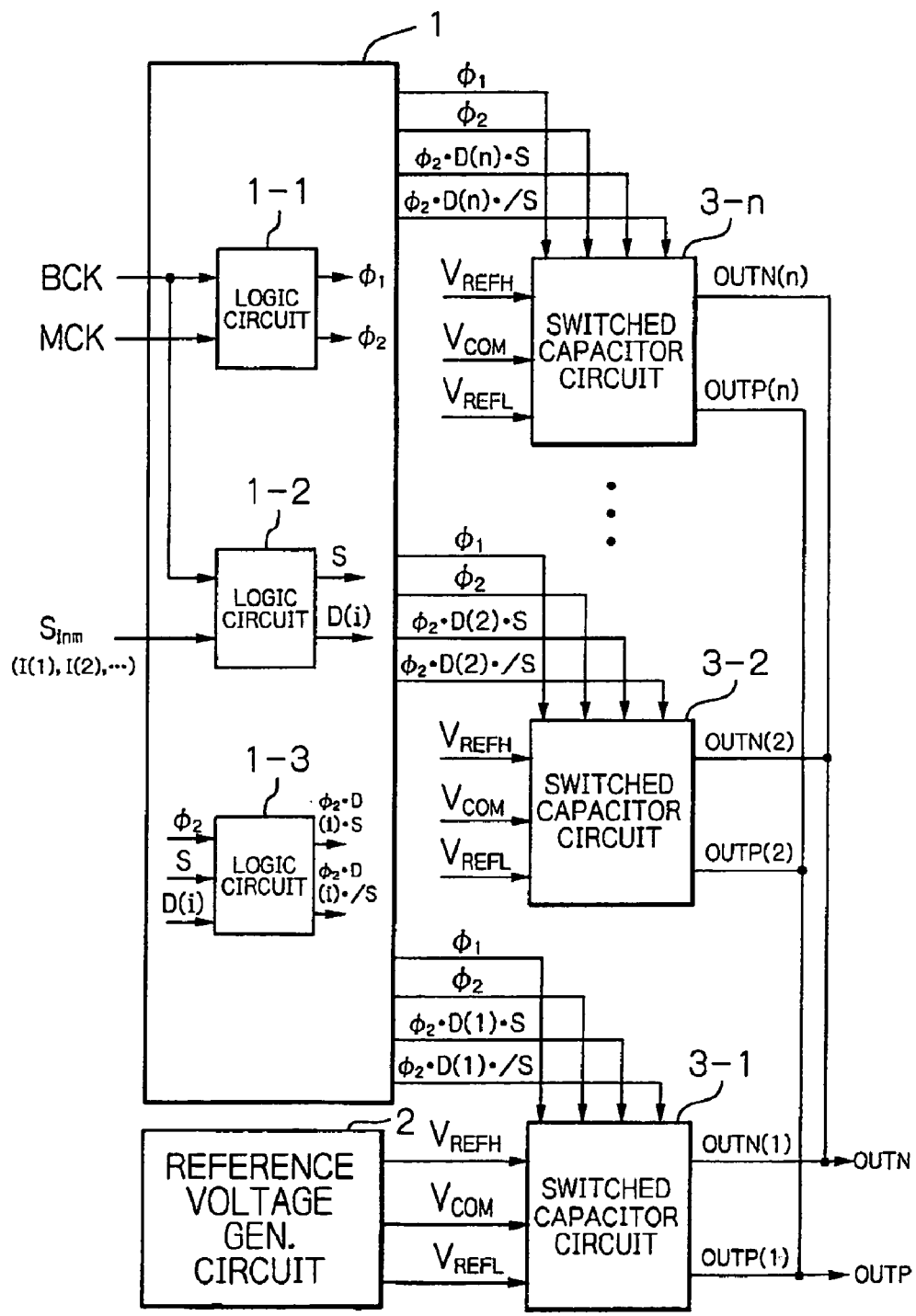
FIG. 6 is a block circuit diagram illustrating a prior art multi-level (multi-bit) D/A converter of a complementary type.
Figure 7:
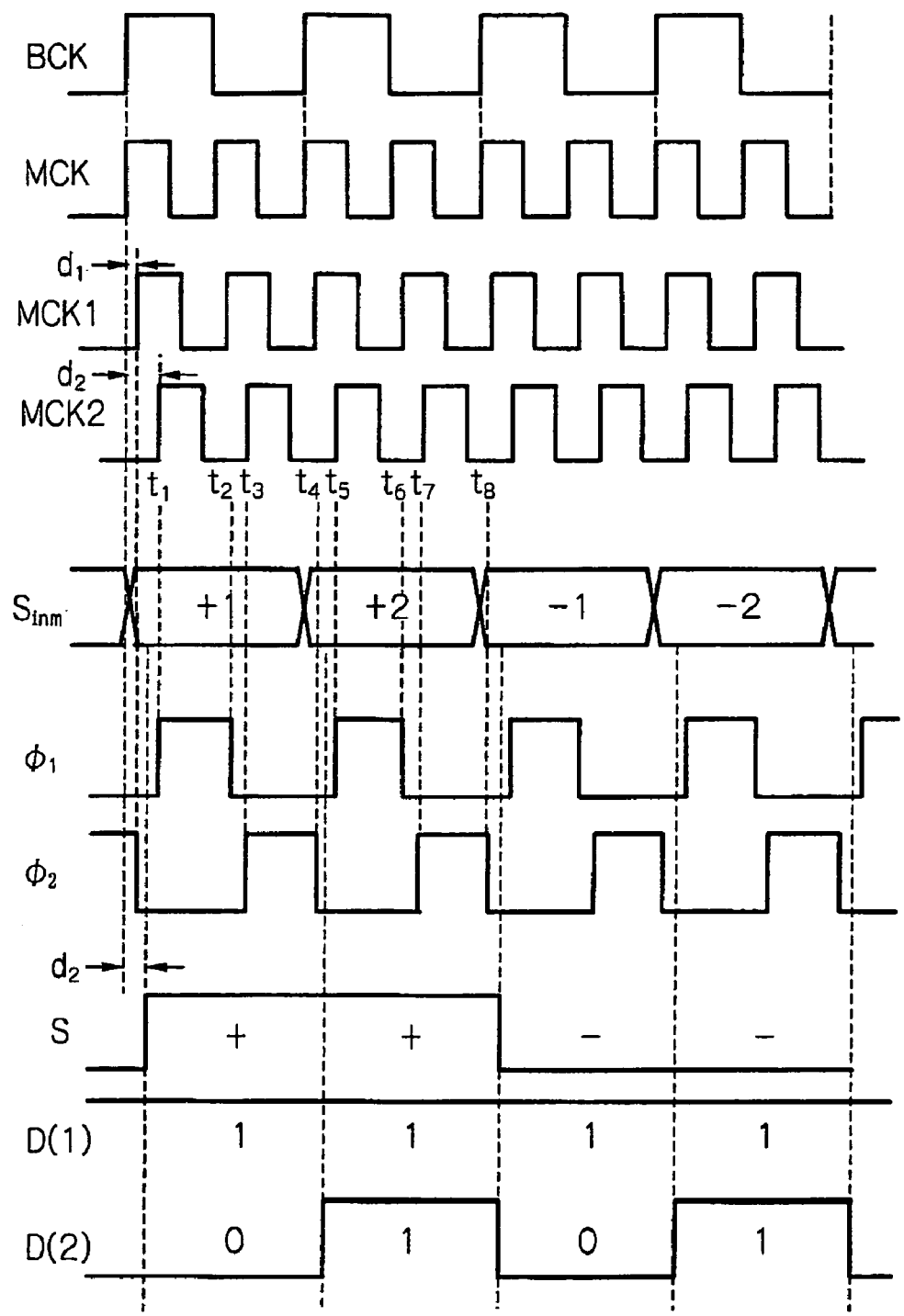
FIG. 7 is a timing diagram for explaining the operation of the switched capacitor circuit of FIG. 6.

In FIG. 6, which illustrates a prior art multi-level D/A converter of a complementary type, a clock generating circuit 1 receives a bit clock signal BCK, a master clock signal MCK and a multi-level digital input signal $S_{inm}$ which area in synchronization with each other. As a result, the clock generating circuit 1 includes a logic circuit 1—1 for generating two clock signals $\phi_1$ and $\phi_2$ opposite in phase in accordance with the bit clock signal BCK and the master clock signal MCK. Note that the logic circuit 1—1 is the same as the logic circuit 101 of FIG. 1. Also, the clock generating circuit 1 includes a logic circuit 1-2 for generating a one-bit sign signal S which shows either "H" (+) or "L" (−) and data signals D(1), D(2), . . . in synchronization with the bit clock signal BCK. That is, as illustrated in FIG. 7, if the multi-level value is defined by four-level values of +2, +1, −1 and −2, the four-level digital input signal $S_{in4}$ is defined by two bit input data I(1) and I(2), so that the logic circuit 1-2 generates the sign signal S and the data signals D(1) and D(2) in accordance with the logic table of FIG. 8. In this case, the sign signal S and the data signals D(1) and D(2) area delayed by a delay time $d_3$ ($d_1 < d_3 < d_2$). Further, the clock generating circuit 1 includes a logic circuit 1-3 for generating clock signals $\phi_2 \cdot D(i) \cdot S$ and $\phi_2 \cdot D(i) \cdot /S$ where I is 1,2, . . . , or n in accordance with the clock signal $\phi_2$, the sign signal S and the data signals D(i).

Also, a reference voltage generating circuit 2 generates reference voltages $V_{REFH}$, $V_{COM}$ and $V_{REFL}$. The reference voltage generating circuit 2 has the same configuration as the reference voltage generating circuit 200 of FIG. 1.

The clock signals $\phi_1$, $\phi_2$, $\phi_2 \cdot D(i) \cdot S$ and $\phi_2 \cdot D(i) \cdot /S$ and the reference voltages $V_{REFH}$, $V_{COM}$ and $V_{REFL}$ are supplied to a switched capacitor circuit 3-i (i=1, 2, . . . , n) which has complementary output terminals OUTP(i) and OUTN(i). The complementary output terminals OUTP(1), OUTP(2), . . . , OUTP(n) are connected to a common complementary output terminal OUTP, and the complementary output terminals OUTN(1), OUTN(2), ..., OUTN(n) are connected to another common complementary output terminal OUTN.

Figure 9:
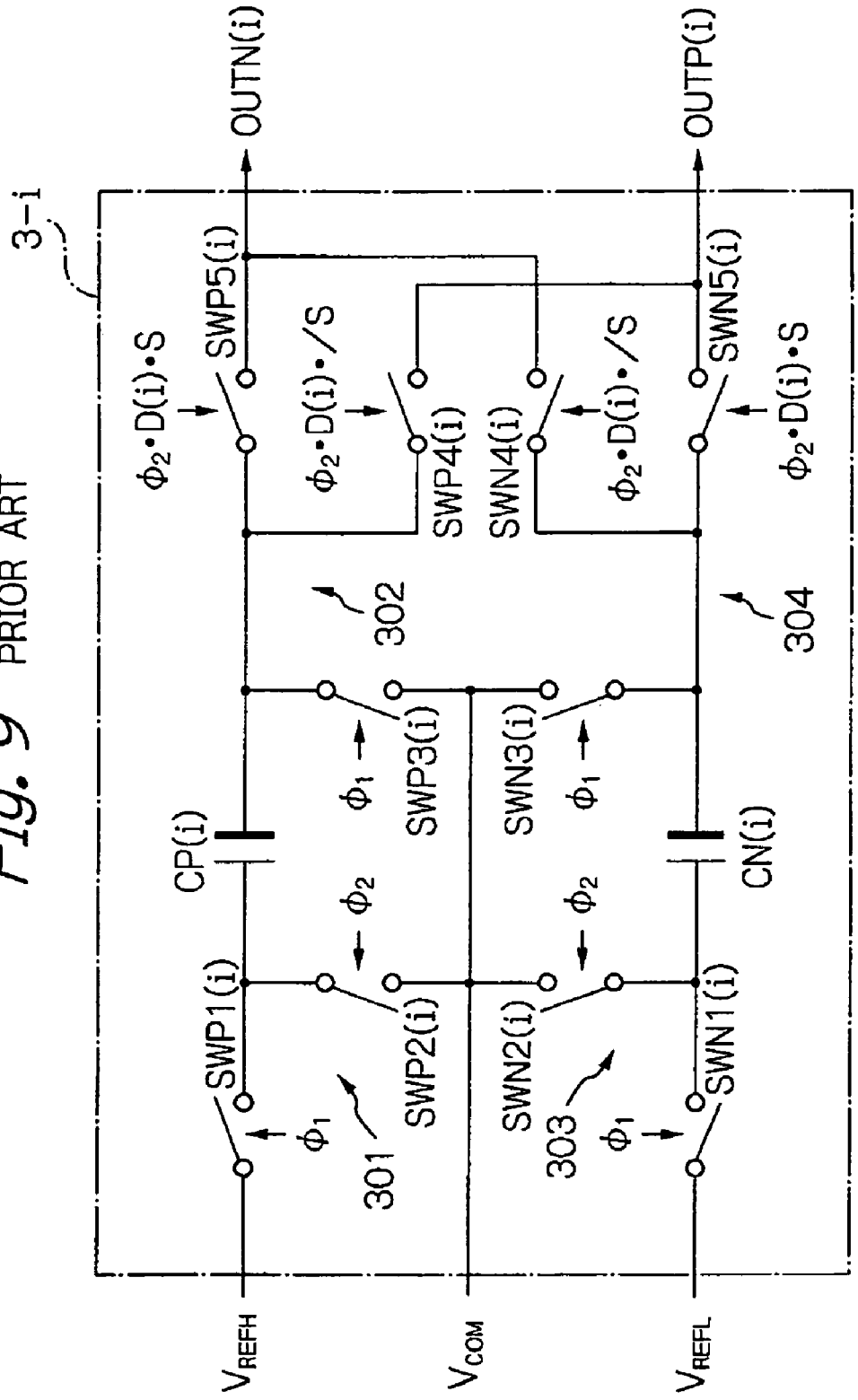
FIG. 9 is a detailed circuit diagram of the switched capacitor circuit of FIG. 6.

In FIG. 9, which is a detailed circuit diagram of the switched capacitor circuit 3-I of FIG. 6, the switched capacitor circuit 3-I has switches SWP1(i), SWP2(i), SWP3(i), SWP4(i), SWP5(i), SWN1(i), SWN2(i), SWN3(i), SWN4(i) and SWN5(i) corresponding to SWP1, SWP2, SWP3, SWP4, SWP5, SWN1, SWN2, SWN3, SNW4 and SWN5 respectively, of the switched capacitor circuit 300 of FIG. 4, except that the switches SWP4(i) and SWN4(i) are controlled by the clock signal $\phi_2 \cdot D(i) \cdot /S$ instead of $\phi_2 \cdot /S$, and the switches SWP5(i) and SWN5(i) are controlled by the clock signal $\phi_2 \cdot D(i) \cdot S$ instead of $\phi_2 \cdot S$.

The operation of the switched capacitor circuits 3-1 and 3-2 of FIG. 9 is next explained with reference to FIGS. 10A through 10H as well as FIG. 7. Note that the switched capacitor circuits 3-3, through 3-n are omitted in order to simplify the description.

Figure 10A:
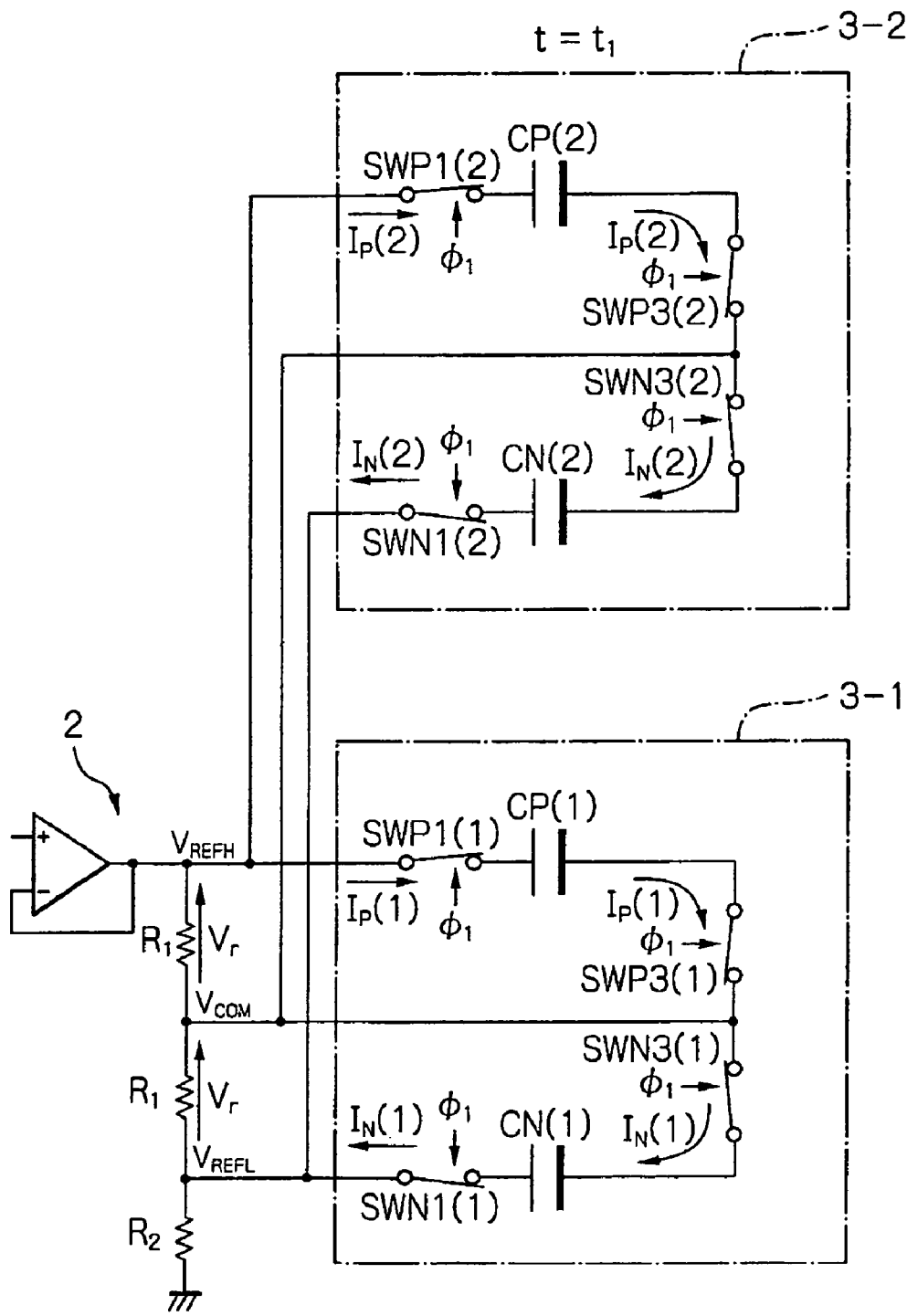

First, at time $t_1$, the clock signal $\phi_1$ rises while the clock signal $\phi_2$ remains low. As a result, as illustrated in FIG. 10A, the switches SWP1(1), SWP3(1), SWN1(1) and SWN3(1) of the switched capacitor circuit 3-1 are turned ON, so that a charging current $I_P(1)$ is supplied to the capacitor CP(1) and a charging current $I_N(1)$ is supplied to the capacitor CN(1). Simultaneously, the switches SWP1(2), SWP3(2), SWN1(2) and SWN3(2) of the switched capacitor circuit 3-2 are turned ON, so that a charging current $I_P(2)$ is supplied to the capacitor CP(2) and a charging current $I_N(2)$ is supplied to the capacitor CN(2). In this case, note that there is no charge in the capacitors CP(1), CN(1), CP(2) and CN(2) in advance.

Next, at time $t_2$, the clock signal $\phi_1$ falls while the clock signal $\phi_2$ remains low. As a result, as illustrated in FIG. 10B, each of the capacitors CP(1) and CP(2) is in a floating state with a charge of Q on the power supply side, and also, each of the capacitors CN(1) and CN(2) is in a floating state with a charge of Q on the non-power supply side.

Figure 10C:
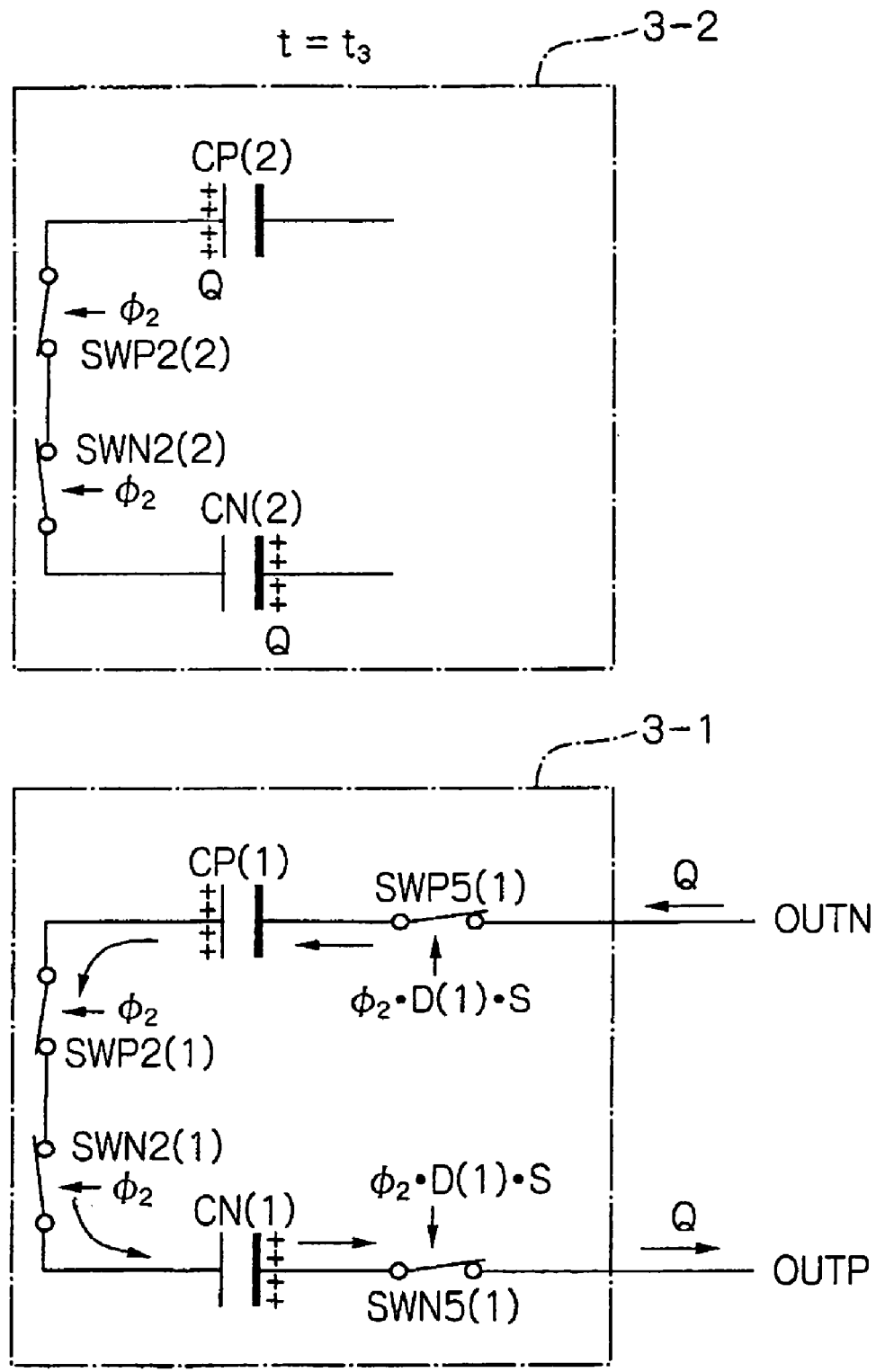

Next, at time $t_3$, the clock signal $\phi_2$ rises while the clock signal $\phi_1$ remains low. As a result, as illustrated in FIG. 10C, the switches SWP2(1), SWP5(1), SWN2(1) and SWN5(1) of the switched capacitor circuit 3-1 are turned ON, so that the charge of Q is supplied from the output terminal OUTN to the capacitor CP(1) and the charge of Q is supplied from the capacitor CN(1) to the output terminal OUTP. On the other hand, only the switches SWP2(2) and SWN2(2) of the switched capacitor circuit 3-2 are turned ON, so that the charge of Q remains in each of the capacitors CP(2) and CN(2).

Next, at time $t_4$, the clock signal $\phi_2$ falls while the clock signal $\phi_1$ remains low. As a result, as illustrated in FIG. 10D, the capacitors CP(1) and CN(1) are in a floating state with no charge; however, the capacitors CP(2) and CN(2) are in a floating state with the charge of Q.

Figure 10E:
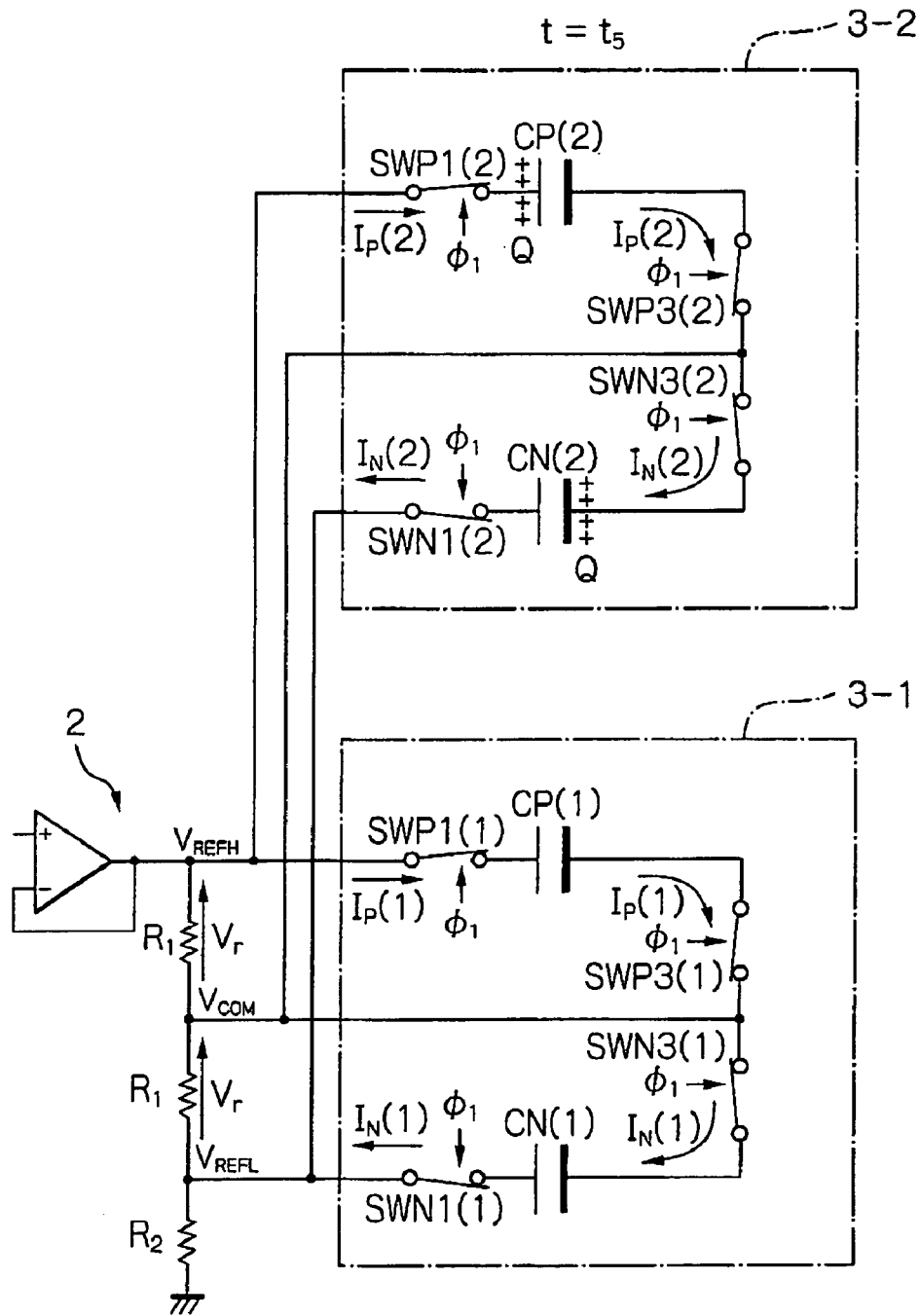

Next, at time $t_5$, the clock signal $\phi_1$ rises while the clock signal $\phi_2$ remains low. As a result, as illustrated in FIG. 10E, the switches SWP1(1), SWP3(1), SWN1(1) and SWN3(1) of the switched capacitor circuit 3-1 are turned ON, so that a charging current $I_P(1)$ is supplied to the capacitor CP(1) and a charging current $I_N(1)$ is supplied to the capacitor CN(1). Simultaneously, the switches SWP1(2), SWP3(2), SWN1(2) and SWN3(2) of the switched capacitor circuit 3-2 are turned ON, so that a charging current $I_P(2)$ is supplied to the capacitor CP(2) and a charging current $I_N(2)$ is supplied to the capacitor CN(2). In this case, since there is no charge in the capacitors CP(1) and CN(1), but the charge of Q is already stored in the capacitors CP(2) and CN(2), the sum of the charging currents $I_P(1)$ and $I_P(2)$ is different from that at time $t_1$, and the sum of the charging currents $I_N(1)$ and $I_N(2)$ at time $t_1$.

Next, at time $t_6$, the clock signal $\phi_1$ falls while the clock signal $\phi_2$ remains low. As a result, as illustrated in FIG. 10F, each of the capacitors CP(1) and CP(2) is in a floating state with a charge of Q on the power supply side, and also, each of the capacitors CN(1) and CN(2) is in a floating state with a charge of Q on the non-power supply side.

Figure 10G:
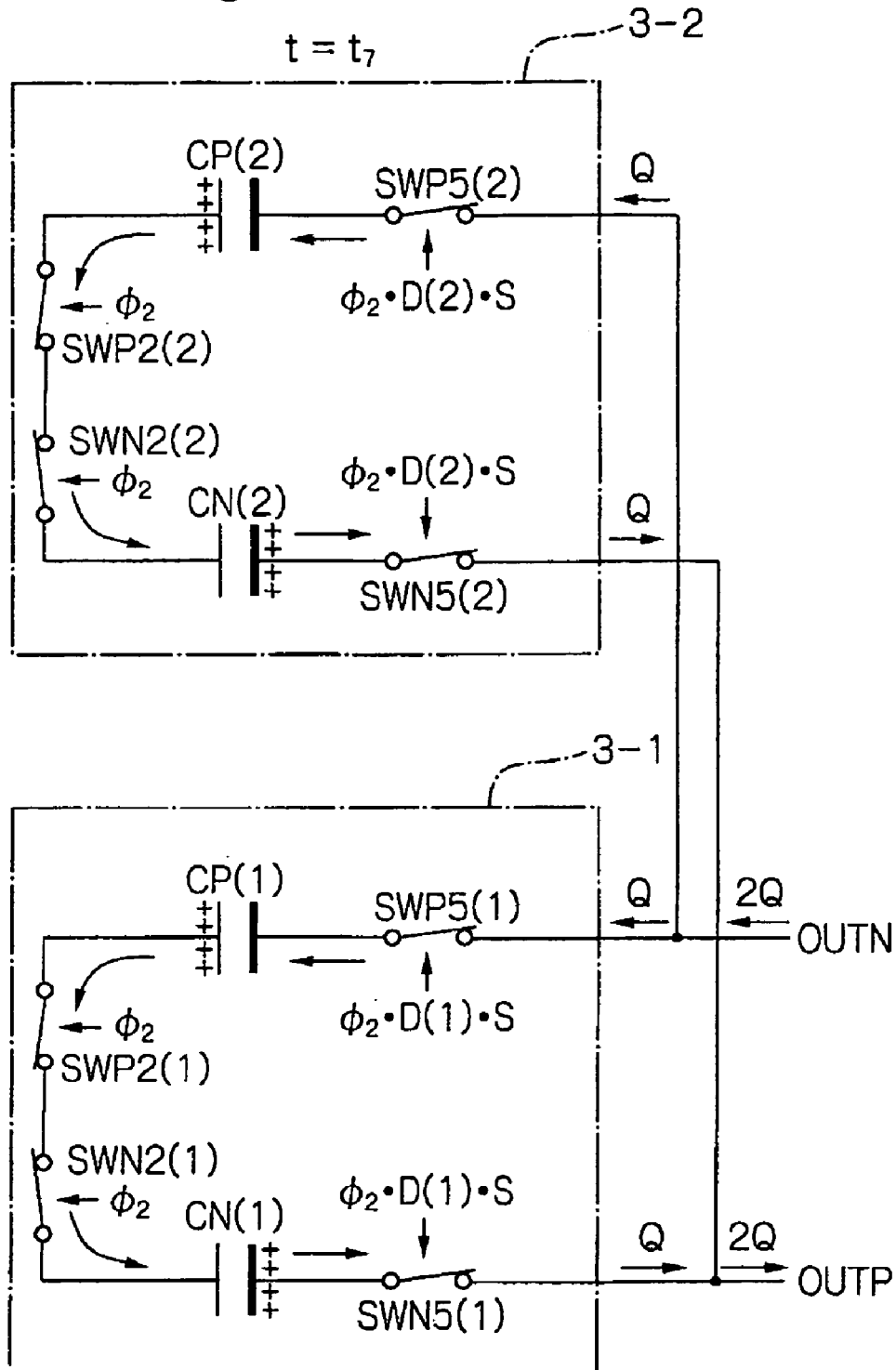

Next, at time $t_7$, the clock signal $\phi_2$ rises while the clock signal $\phi_1$ remains low. As a result, as illustrated in FIG. 10G, the switches SWP2(1), SWP5(1), SWN2(1) and SWN5(1) of the switched capacitor circuit 3-1 are turned ON, so that the charge of Q is supplied from the output terminal OUTN to the capacitor CP(1) and the charge of Q is supplied from the capacitor CN(1) to the output terminal OUTP. Simultaneously, the switches SWP2(2), SWP5(2), SWN2(2) and SWN5(2) of the switched capacitor circuit 3-2 are turned ON, so that the charge of Q is supplied from the output terminal OUTN to the capacitor CP(2) and the charge of Q is supplied from the capacitor CN(2) to the output terminal OUTP. Thus, a charge of 2Q is supplied from the output terminal OUTN to the switched capacitor circuits 3-1 and 3-2, and a charge of 2Q is supplied from the switched capacitor circuits 3-1 and 3-2 to the output terminal OUTP.

Finally, at time $t_8$, the clock signal $\phi_2$ falls while the clock signal $\phi_1$ remains low. As a result, as illustrated in FIG. 10H, the capacitors CP(1) and CN(1) are in a floating state with no charge, and the capacitors CP(2) and CN(2) are in a floating state with no charge.

Thus, since some of the capacitors CP(1), CN(1), CP(2) and CN(2) may be in a floating state with a charge of Q before the next charging operation, the sum of the charging currents $I_P(1)$ and $I_P(2)$ and the sum of the charging currents $I_N(1)$ and $I_N(2)$ at time $t_1$ are different from those at time $t_5$. In other words, the charging currents $I_P(i)$ and $I_N(i)$ are dependent upon the sign signal S and the data signal D(i), so that the load of the reference voltage generating circuit 2 is changed depending upon the sign signal and the data signal D(i). Therefore, the settling error is dependent upon the sign signal S and the data signal D(i), which would degrade the total harmonic distortion (THD) characteristics and the signal-to-noise (S/N) characteristics.

Figure 11:
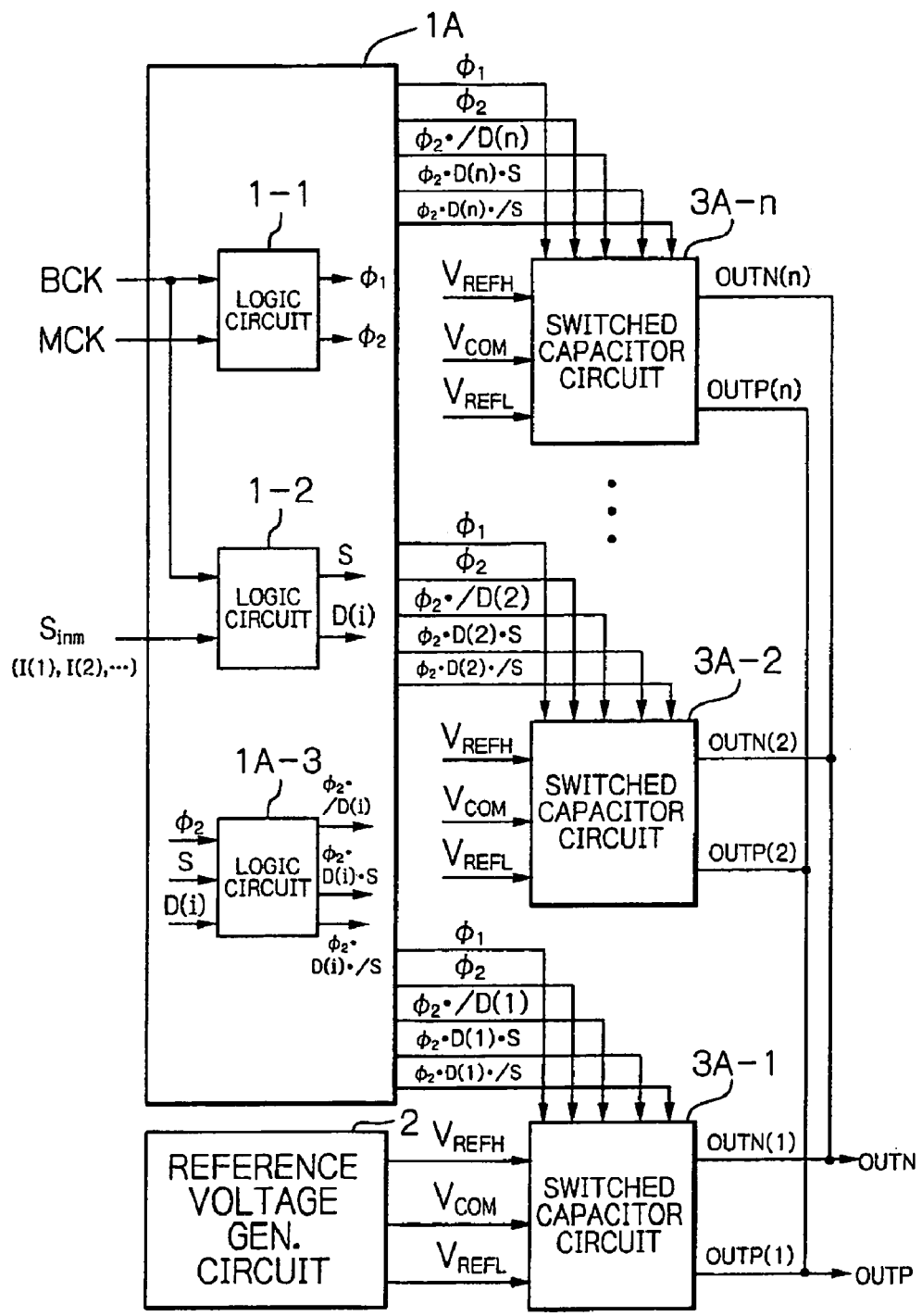
FIG. 11 is a block circuit diagram illustrating a first embodiment of the multi-level (multi-bit) D/A converter according to the present invention.

In FIG. 11, which illustrates a first embodiment of the multi-level D/A converter according to the present invention, this D/A converter is of a complementary type. A clock generating circuit 1A generates a clock signal $\phi_2 \cdot /D(i)$ in addition to the clock signals $\phi_1$, $\phi_2$, $\phi_2 \cdot D(i) \cdot S$ and $\phi_2 \cdot D(i) \cdot /S$ of the clock generating circuit 1 of FIG. 6.

That is, the clock generating circuit 1A includes a logic circuit 1A-3 instead of the logic circuit 1-3 of FIG. 6. The logic circuit 1A-3 generates the clock signal $\phi_2 \cdot /D(i)$ in addition to the clock signals $\phi_2 \cdot D(i) \cdot S$ and $\phi_2 \cdot D(i) \cdot /S$.

The clock signals $\phi_1$, $\phi_2$, $\phi_2 \cdot /D(i)$, $\phi_2 \cdot D(i) \cdot S$ and $\phi_2 \cdot D(i) \cdot /S$ and the reference voltages $V_{REFH}$, $V_{COM}$ and $V_{REFL}$ are supplied to a switched capacitor circuit 3A-i (i=1, 2, ..., n) which has complementary output terminals OUTP(i) and OUTN(i).

Figure 12:
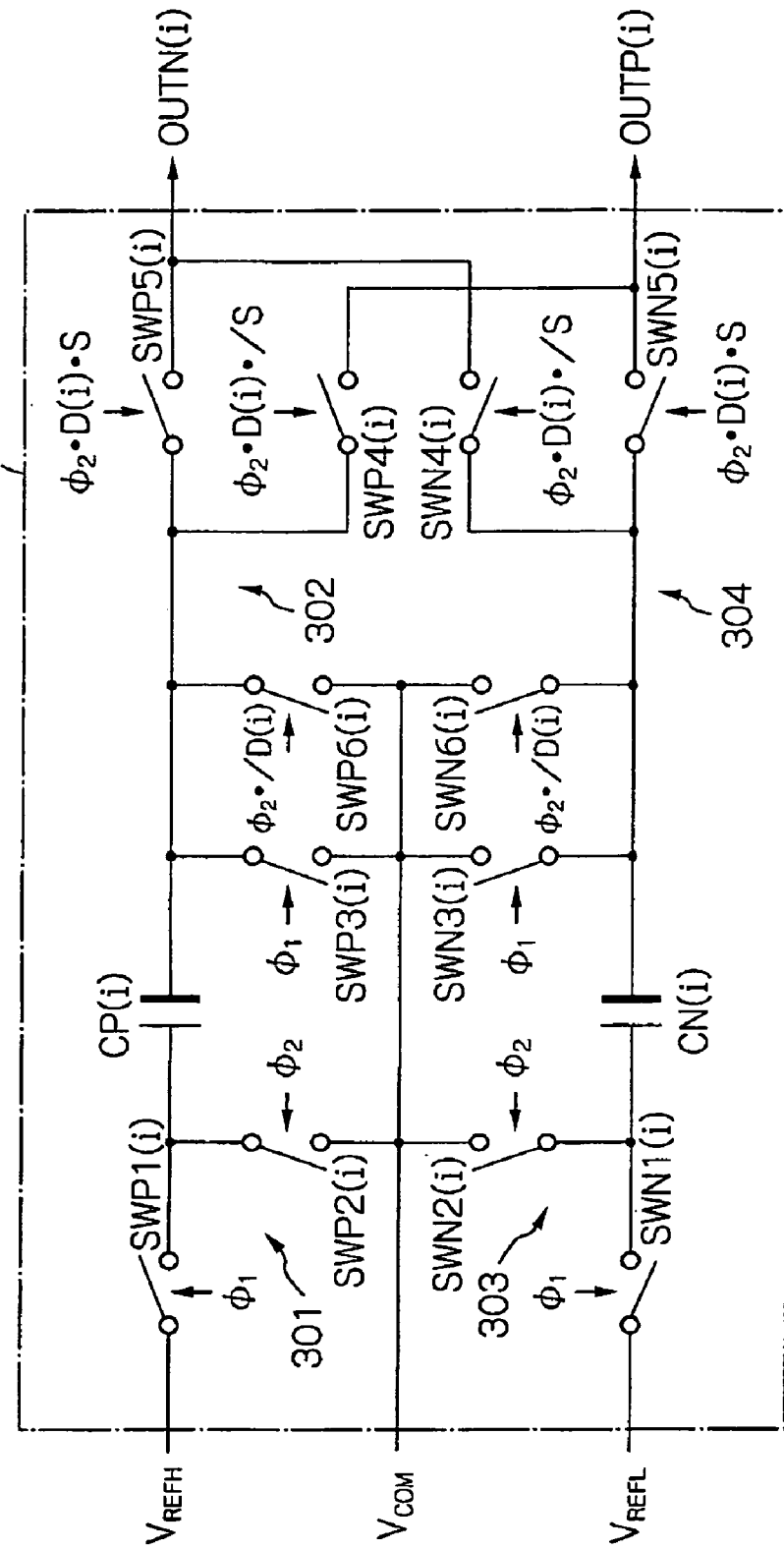
FIG. 12 is a detailed circuit diagram of the switched capacitor circuit of FIG. 11.

In FIG. 12, which is a detailed circuit diagram of the switched capacitor circuit 3A-i of FIG. 11, the switched capacitor circuit 3A-i has switches SWP6(i) and SWN6(i) controlled by the clock signal $\phi_2 \cdot /D(i)$, in addition to the switches of the switched capacitor circuit 3-i of FIG. 9. The switches SWP6(i) and SWN6(i) are included in the switch circuits 302 and 304, respectively.

The operation of the switched capacitor circuits 3A-1 and 3A-2 of FIGS. 11 and 12 is explained with reference to FIGS. 13A through 13H as well as FIG. 7. Note that the switched capacitor circuits 3A-3 through 3A-n are omitted in order to simplify the description.

Figure 13A:
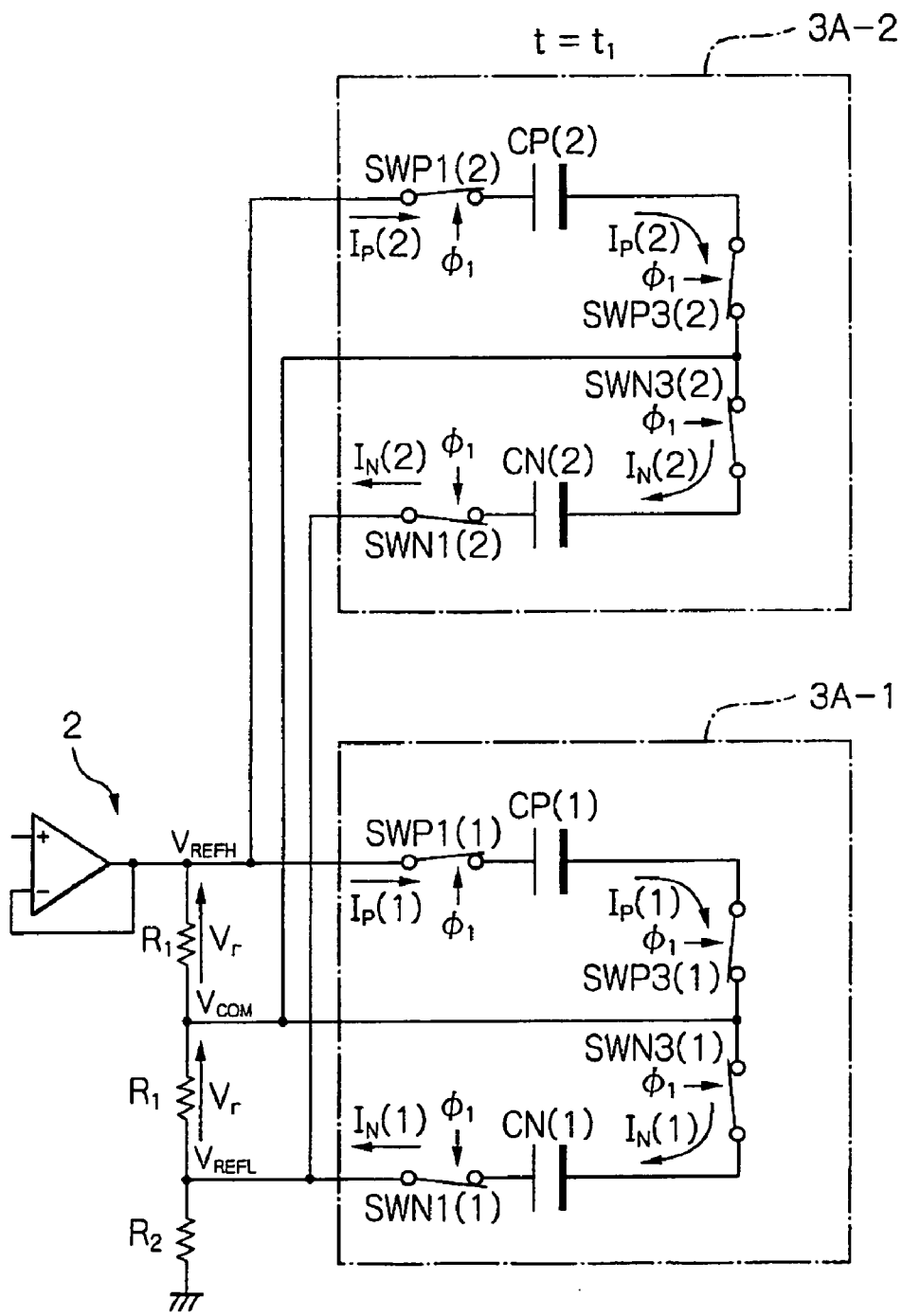

First, at time $t_1$, the clock signal $\phi_1$ rises while the clock signal $\phi_2$ remains low. As a result, as illustrated in FIG. 13A, the switches SWP1(1), SWP3(1), SWN1(1) and SWN3(1) of the switched capacitor circuit 3A-1 are turned ON, so that a charging current $I_P(1)$ is supplied to the capacitor CP(1) and a charging current $I_N(1)$ is supplied to the capacitor CN(1). Simultaneously, the switches SWP1(2), SWP3(2), SWN1(2) and SWN3(2) of the switched capacitor circuit 3A-2 are turned ON, so that a charging current $I_P(2)$ is supplied to the capacitor CP(2) and a charging current $I_N(2)$ is supplied to the capacitor CN(2). In this case, note that there is no charge in the capacitors CP(1), CN(1), CP(2) and CN(2) in advance.

Figure 13B:
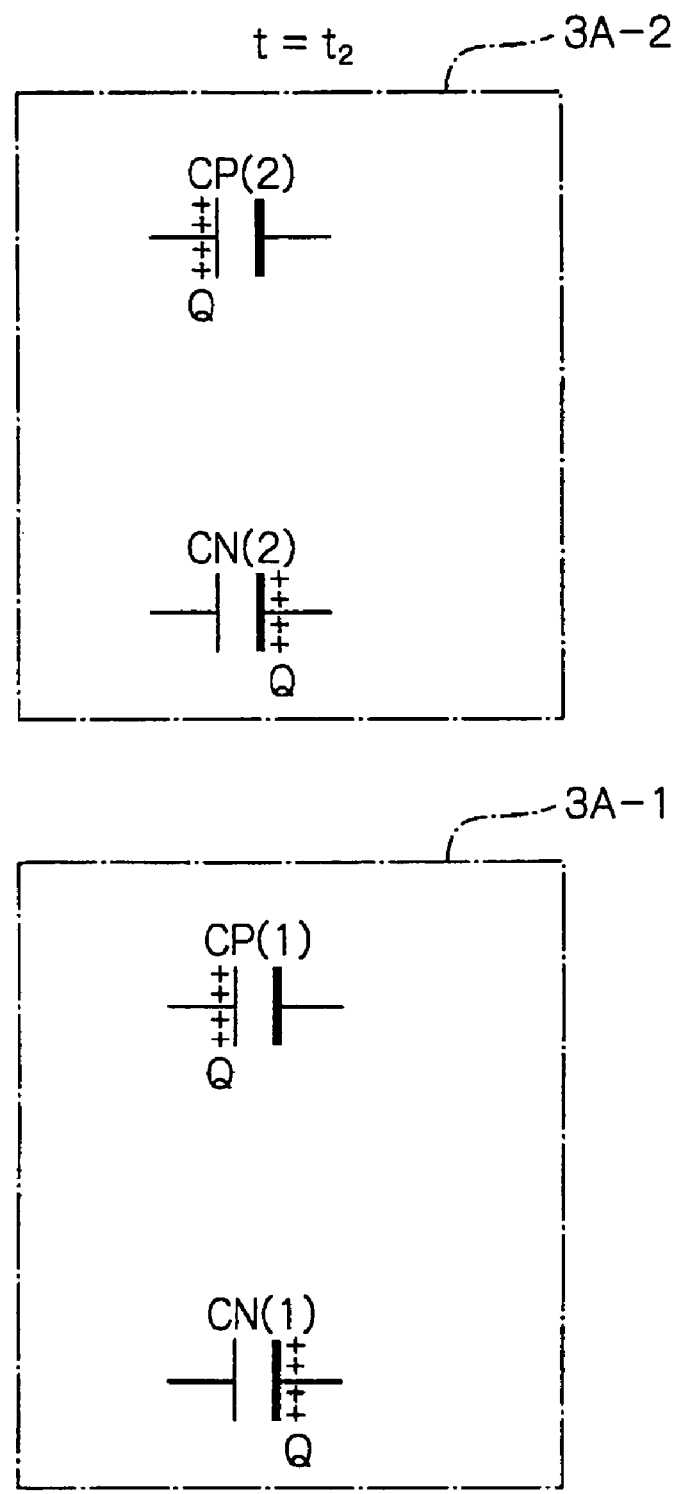

Next, at time $t_2$, the clock signal $\phi_1$ falls while the clock signal $\phi_2$ remains low. As a result, as illustrated in FIG. 13B, each of the capacitors CP(1) and CP(2) is in a floating state with a charge of Q on the power supply side, and also, each of the capacitors CN(1) and CN(2) is in a floating state with a charge of Q on the non-power supply side.

Next, at time $t_3$, the clock signal $\phi_2$ rises while the clock signal $\phi_1$ remains low. As a result, as illustrated in FIG. 13C, the switches SWP2(1), SWP5(1), SWN2(1) and SWN5(1) of the switched capacitor circuit 3A-1 are turned ON, so that the charge of Q is supplied from the output terminal OUTN to the capacitor CP(1) and the charge of Q is supplied from the capacitor CN(1) to the output terminal OUTP. On the other hand, the switches SWP2(2), SPW6(2), SWN2(2) and SWN6(2) of the switched capacitor circuit 3A-2 are turned ON, so that the charge of Q flows from one of the capacitors CP(2) and CN(2) to the other.

Next, at time $t_4$, the clock signal $\phi_2$ falls while the clock signal $\phi_1$ remains low. As a result, as illustrated in FIG. 13D, the capacitors CP(1) and CN(1) are in a floating state with no charge, and also, the capacitors CP(2) and CN(2) are in a floating state with no charge.

Figure 13E:
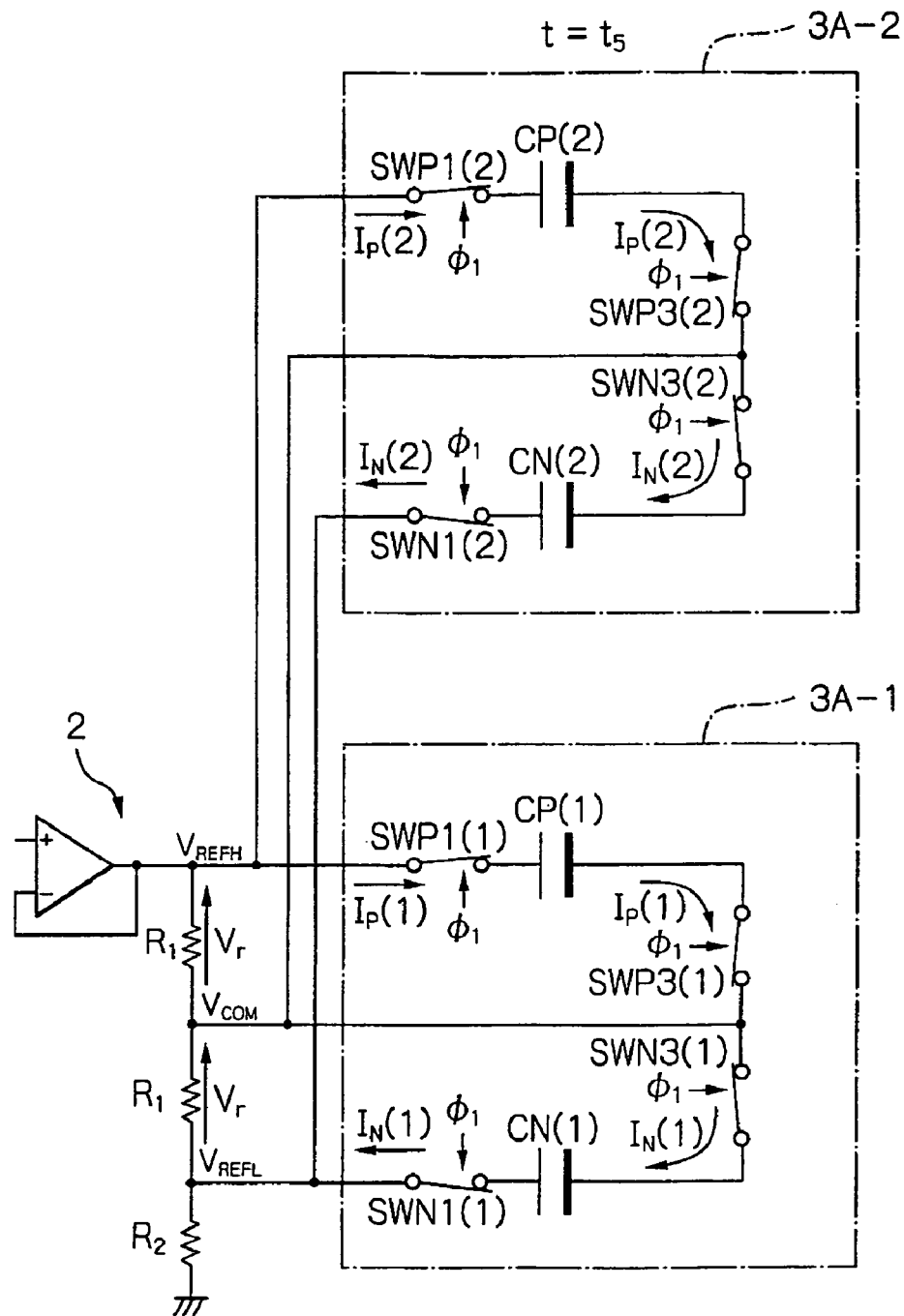

Next, at time $t_5$, the clock signal $\phi_1$ rises while the clock signal $\phi_2$ remains low. As a result, as illustrated in FIG. 13E, the switches SWP1(1), SWP3(1), SWN1(1) and SWN3(1) of the switched capacitor circuit 3A-1 are turned ON, so that a charging current $I_P(1)$ is supplied to the capacitor CP(1) and a charging current $I_N(1)$ is supplied to the capacitor CN(1). Simultaneously, the switches SWP1(2), SWP3(2), SWN1(2) and SWN3(2) of the switched capacitor circuit 3A-2 are turned ON, so that a charging current $I_P(2)$ is supplied to the capacitor CP(2) and a charging current $I_N(2)$ is supplied to the capacitor CN(2). Even in this case, note that there is no charge in the capacitors CP(1), CN(1), CP(2) and CN(2) in advance. Therefore, the sum of the charging currents $I_P(1)$ and $I_P(2)$ is the same as that at time $t_1$, and the sum of the charging currents $I_N(1)$ and $I_N(2)$ is the same as that at time $t_1$.

Figure 13F:
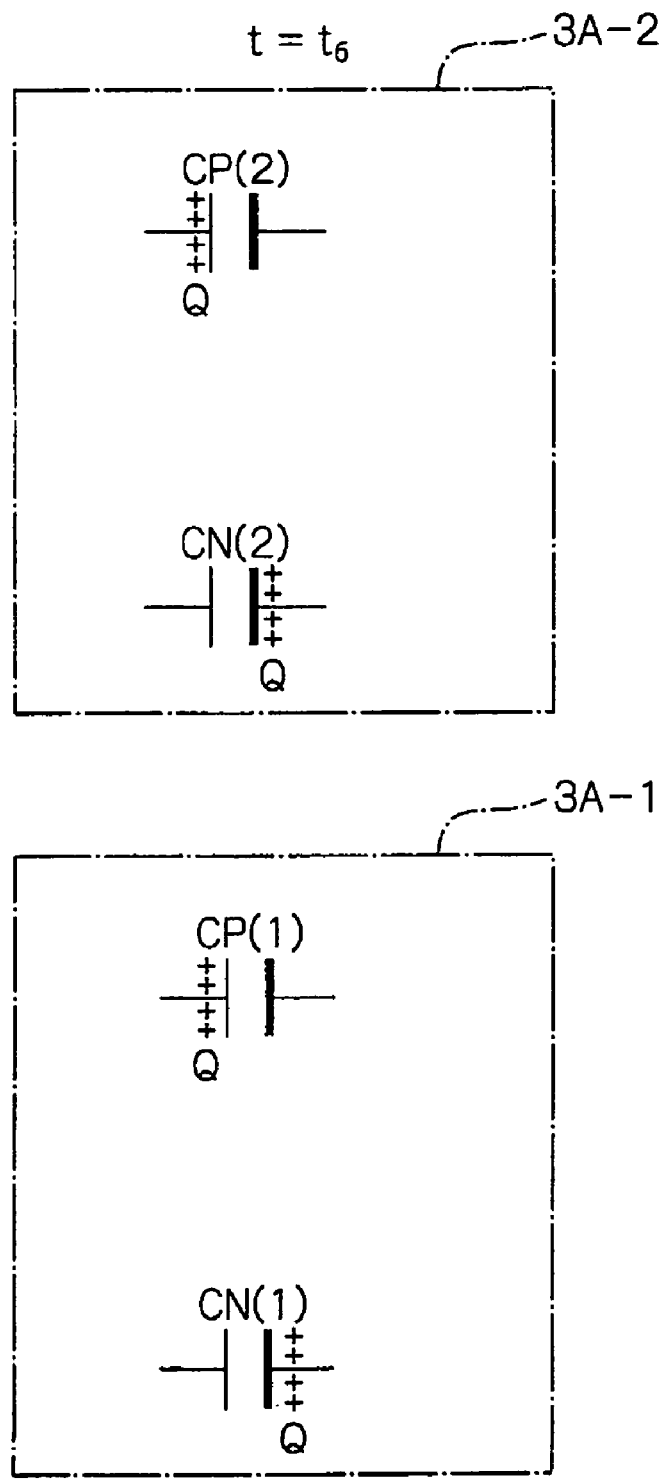

Next, at time $t_6$, the clock signal $\phi_1$ falls while the clock signal $\phi_2$ remains low. As a result, as illustrated in FIG. 13F, each of the capacitors CP(1) and CP(2) is in a floating state with a charge of Q on the power supply side, and also, each of the capacitors CN(1) and CN(2) is in a floating state with a charge of Q on the non-power supply side.

Figure 13G:
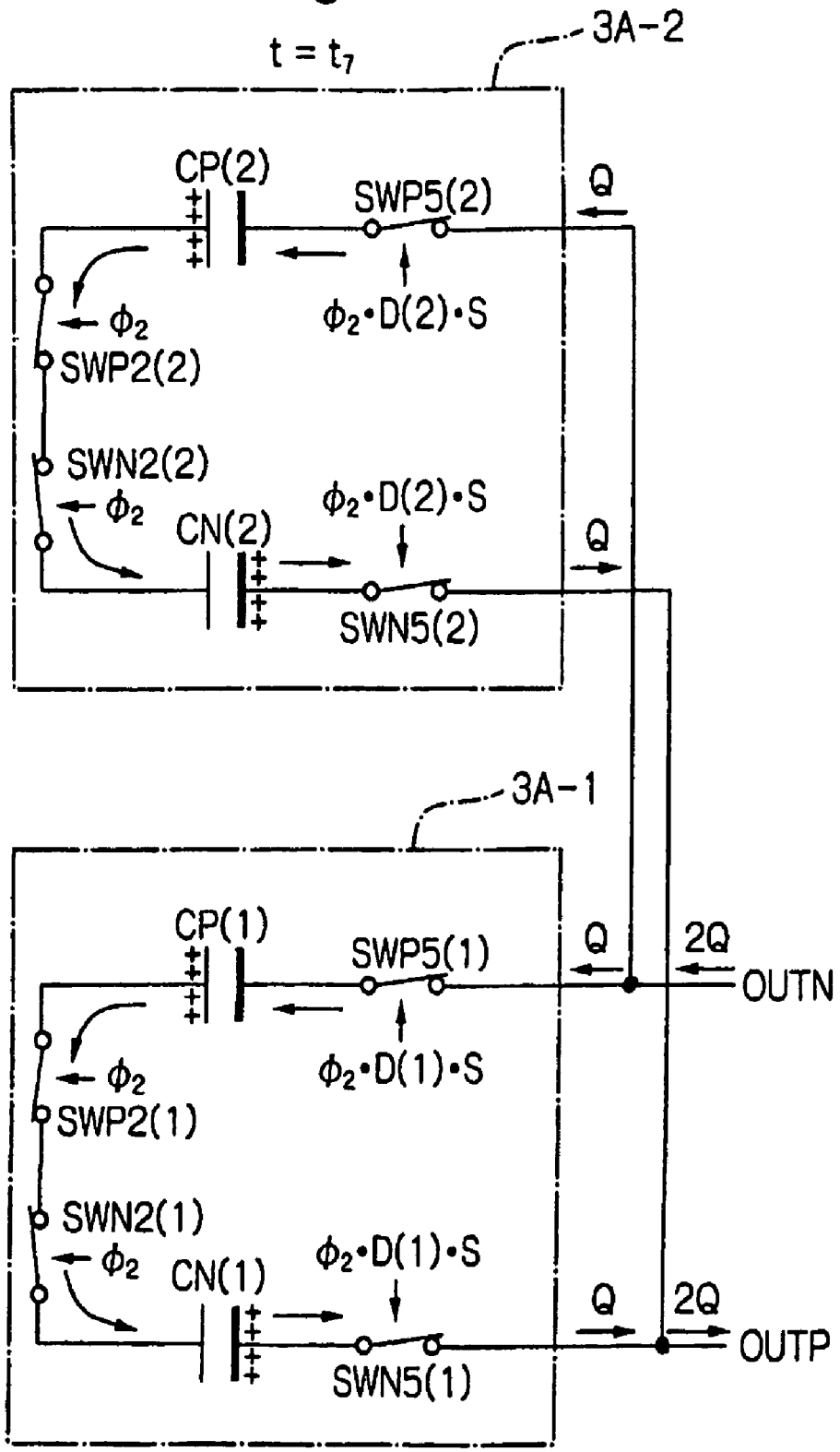

Next, at time $t_7$, the clock signal $\phi_2$ rises while the clock signal $\phi_1$ remains low. As a result, as illustrated in FIG. 13G, the switches SWP2(1), SWP5(1), SWN2(1) and SWN5(1) of the switched capacitor circuit 3A-1 are turned ON, so that the charge of Q is supplied from the output terminal OUTN to the capacitor CP(1) and the charge of Q is supplied from the capacitor CN(1) to the output terminal OUTP. Simultaneously, the switches SWP2(2), SWP5(2), SWN2(2) and SWN5(2) of the switched capacitor circuit 3A-2 are turned ON, so that the charge of Q is supplied from the output terminal OUTN to the capacitor CP(2) and the charge of Q is supplied from the capacitor CN(2) to the output terminal OUTP. Thus, a charge of 2Q is supplied from the output terminal OUTN to the switched capacitor circuits 3A-1 and 3A-2, and a charge of 2Q is supplied from the switched capacitor circuits 3A-1 and 3A-2 to the output terminal OUTP.

Finally, at time $t_8$, the clock signal $\phi_2$ falls while the clock signal $\phi_1$ remains low. As a result, as illustrated in FIG. 13H, the capacitors CP(1) and CN(1) are in a floating state with no charge, and the capacitors CP(2) and CN(2) are in a floating state with no charge.

Thus, since all the capacitors CP(1), CN(1) CP(2) and CN(2) are in a floating state with no charge before the next charging operation, the charging currents $I_P(1)$, $I_N(1)$, $I_P(2)$ and $I_N(2)$ at time $t_1$ are the same as those at time $t_5$. In other words, the charging currents $I_P(i)$ and $I_N(i)$ are definite regardless of the sign signal S and the data signal D(i), so that the load of the reference voltage generating circuit 2 is definite regardless of the sign signal and the data signal D(i). Therefore, the settling error is not dependent upon the sign signal S and the data signal D(i), which would not degrade the total harmonic distortion (THD) characteristics and the signal-to-noise (S/N.) characteristics.

In FIG. 12, note that, if the sign signal S is unnecessary, the switches SWP4(i) and SWN4(i) are deleted and the switches SWP5(i) and SWN5(i) are controlled by a clock signal $\phi_2 \cdot D(i)$.

Figure 14:
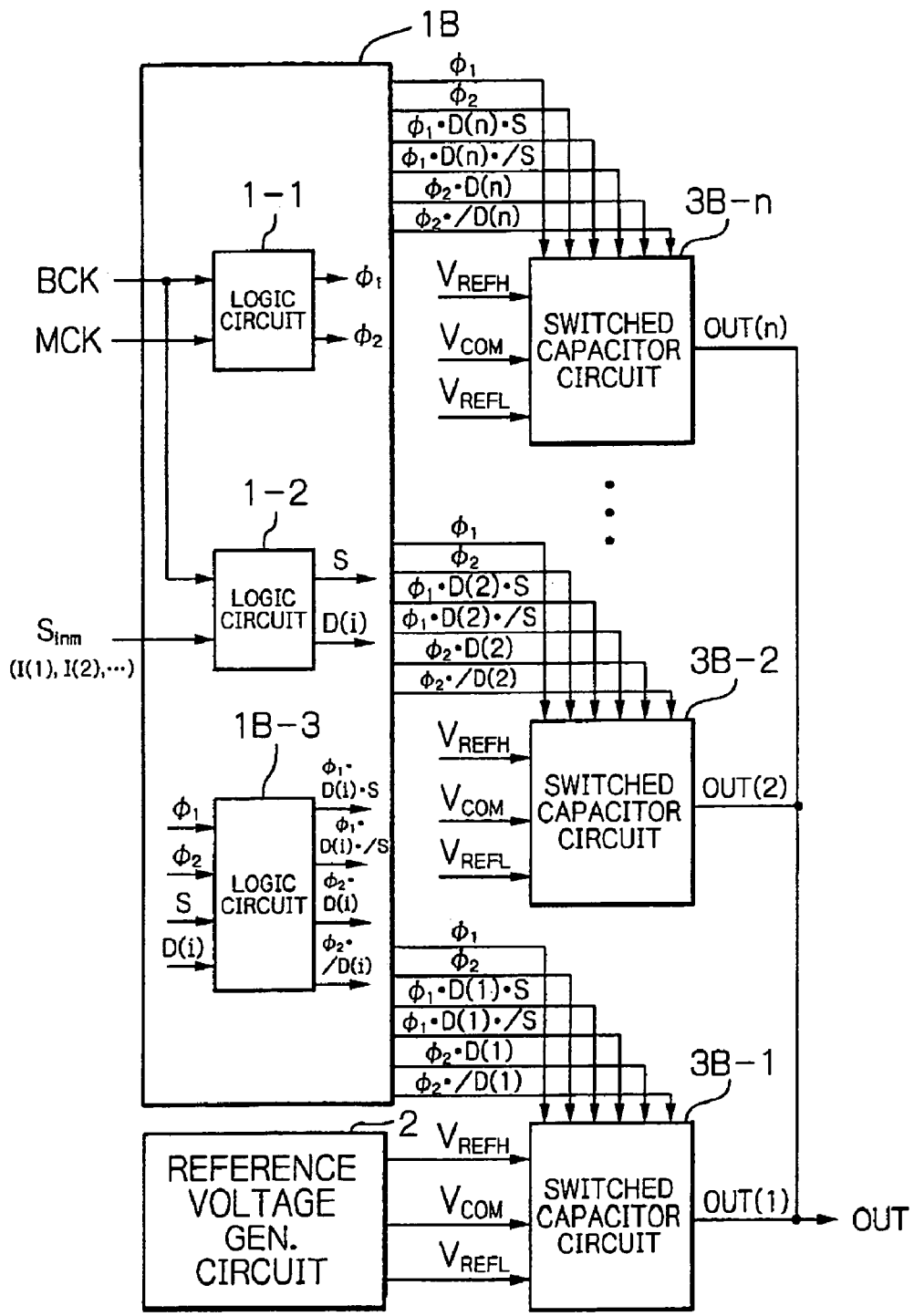
FIG. 14 is a block circuit diagram illustrating a second embodiment of the multi-level (multi-bit) D/A converter according to the present invention.

In FIG. 14, which illustrates a second embodiment of the multi-level D/A converter according to the present invention, this D/A converter is of a non-complementary type. A clock generating circuit 1B generates clock signals $\phi_1$, $\phi_2$, $\phi_1 \cdot D(i) \cdot S$, $\phi_1 \cdot D(i) \cdot /S$, $\phi_2 \cdot D(i)$ and $\phi_2 \cdot /D(i)$. That is, a logic circuit 1B-3 of the clock generating circuit 1B generates the latter four signals.

The clock signals $\phi_1$, $\phi_2$, $\phi_1 \cdot D(i) \cdot S$, $\phi_1 \cdot D(i) \cdot /S$, $\phi_2 \cdot D(i)$ and $\phi_2 \cdot /D(i)$ and the reference voltages $V_{REFH}$, $V_{COM}$ and $V_{REFL}$ are supplied to a switched capacitor circuit 3B-i (i=1, 2, ..., n) which has an output terminal OUT(i) which is connected to a common output terminal OUT.

Figure 15:
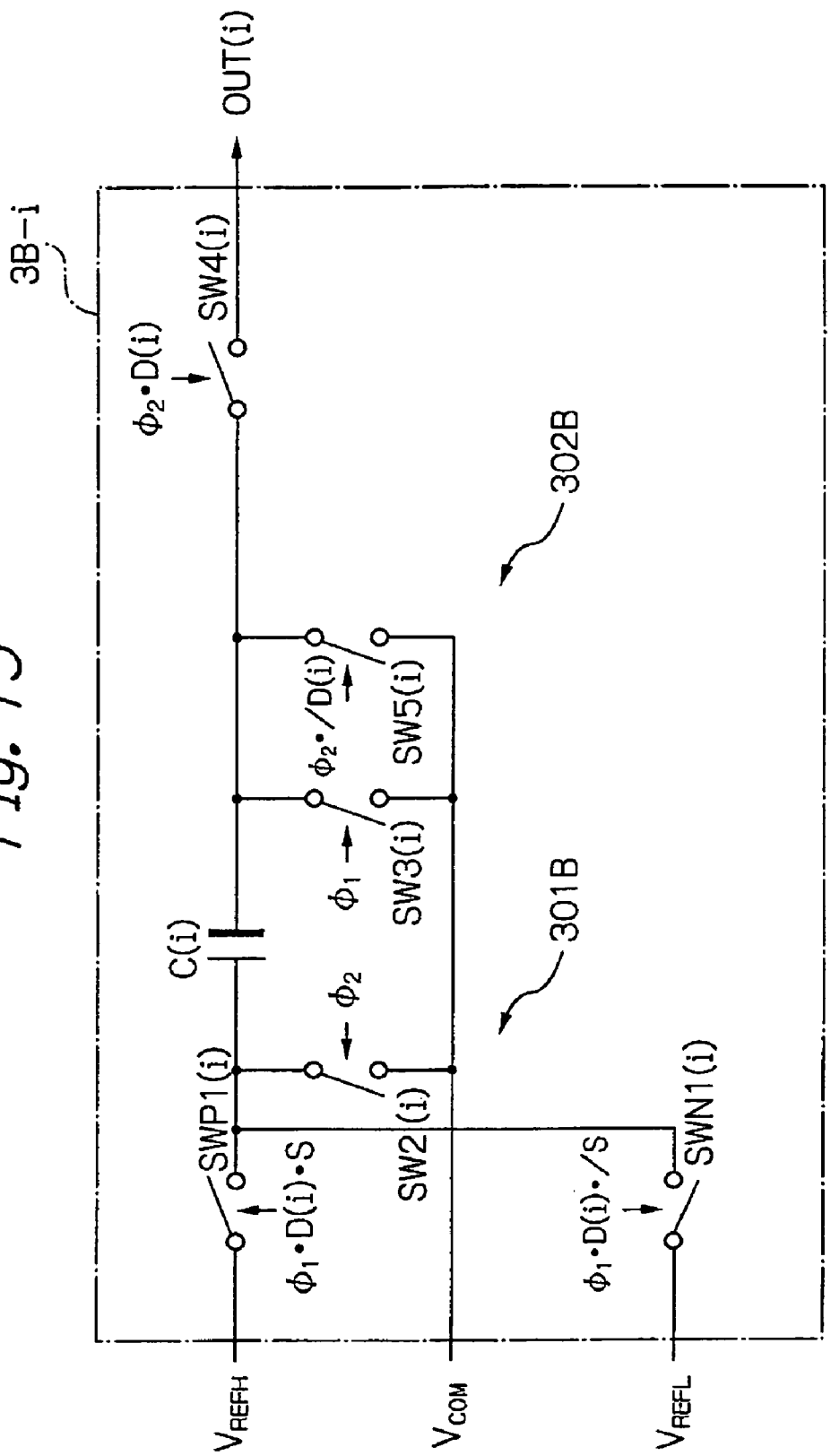
FIG. 15 is a detailed circuit diagram of the switched capacitor circuit of FIG. 14.

In FIG. 15, which is a detailed circuit diagram of the switched capacitor circuit 3B-i of FIG. 14, the switched capacitor circuit 3B-i is constructed by a switch circuit 301B formed by switches SWP1(i), SWN1(i) and SW2(i), a switch circuit 302B formed by switches SW3(i), SW4(i) and SW5(i), and a capacitor C(i).

In FIG. 15, the switches SWP1(i) and SWN1(i) correspond to those of FIG. 12; however, the switches SWP1(i) and SWN1(i) of FIG. 15 are controlled by the clock signals $\phi_1 \cdot D(i) \cdot S$ and $\phi_1 \cdot D(i) \cdot /S$, respectively. Also, the switch SW3(i) corresponds to the switches SWP2(i) and SWN2(i) of FIG. 12. Also the switch SW4(i) corresponds to the switches SWP4(i), SWP5(i), SWN4(i) and SWN5(i) of FIG. 12; however, the switch SW4(i) is controlled by the clock signal $\phi_2 \cdot D(i)$. Further, the switch SW5(i) corresponds to the switches SWP6(i) and SWN(6) of FIG. 12.

Even in the switched capacitor circuit 3B-i, the capacitor C(i) is charged by the switch SWP1(i) or SWN1(i) as well as the switch SW3(i), so that a charge of Q is stored in the capacitor C(i) on the power supply side or on the non power supply side. Then, the capacitor C(i) is discharged by the switch SW4(i) or SW5(i) as well as the switch SW2(i) so that the charge of Q is discharged from the capacitor C(i) to the output terminal OUT(i), or the power supply terminal $V_{COM}$. Thus, since the capacitor C(i) is in a floating state with no charge before the next charging operation, the load of the reference voltage generating circuit 2 is definite regardless of the sign signal S and the data signal D(i). Therefore, the settling error is not dependent upon the sign signal S and the data signal D(i), which would not degrade the total harmonic distortion (THD) characteristics and the signal-to-noise (S/N) characteristics.

In FIG. 15, note that, if the sign signal S is unnecessary, the switch SWN1(i) is deleted and the switch SWP1(i) is controlled by a clock signal $\phi_1 \cdot D(i)$.

Figure 16:
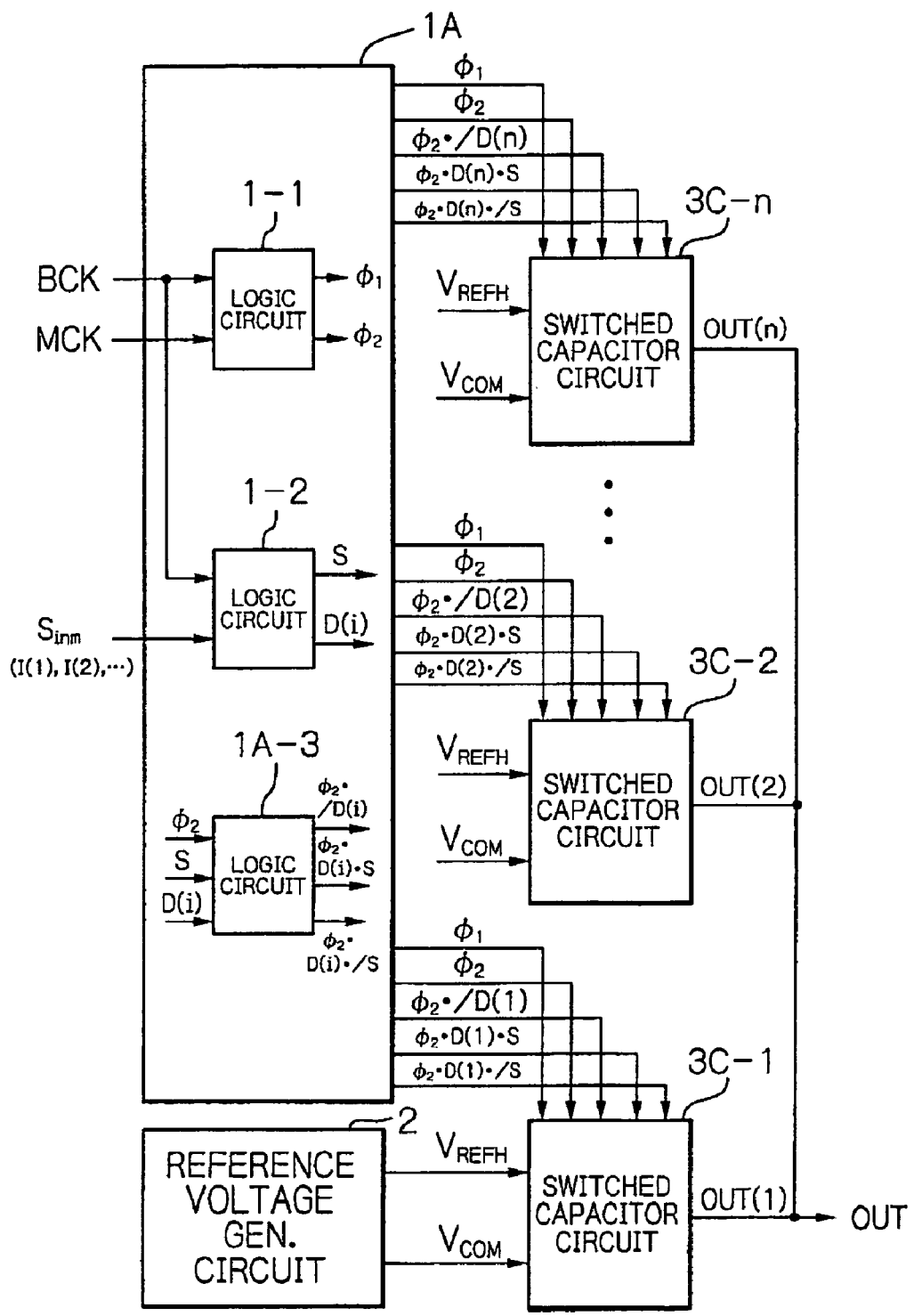
FIG. 16 is a block circuit diagram illustrating a third embodiment of the multi-level (multi-bit) D/A converter according to the present invention.

In FIG. 16, which illustrates a third embodiment of the multi-level D/A converter according to the present invention, this D/A converter is of a non-complementary type.

The clock signals $\phi_1$, $\phi_2$, $\phi_2 \cdot /D(i)$, $\phi_2 \cdot D(i) \cdot S$, and $\phi_2 \cdot D(i) \cdot /S$ and the reference voltages $V_{REFH}$, $V_{COM}$ and $V_{REFL}$ are supplied to a switched capacitor circuit 3C-i (i =1, 2, ..., n) which has an output terminal OUT(i) which is connected to a common output terminal OUT.

Figure 17:
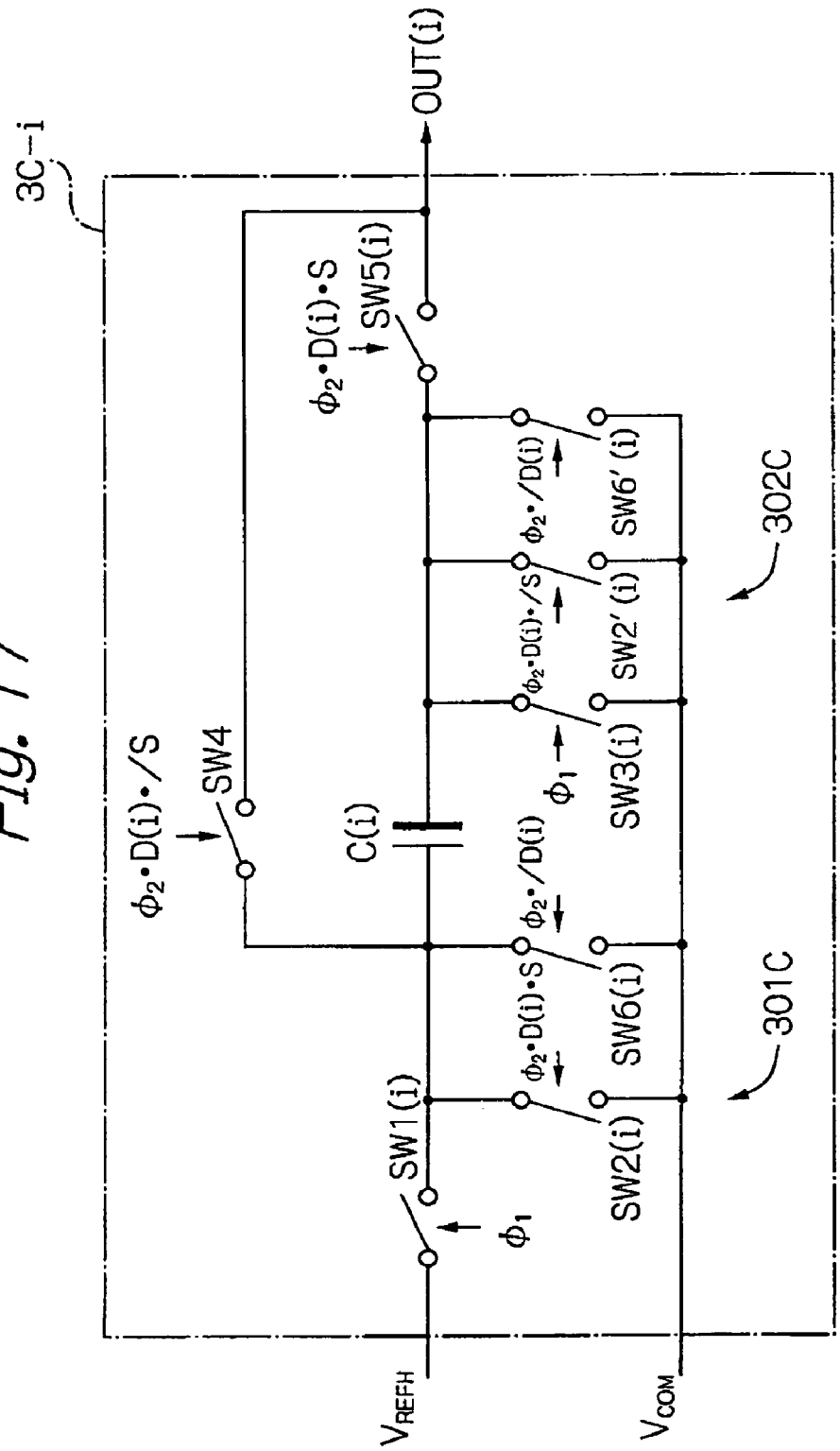
FIG. 17 is a detailed circuit diagram of the switched capacitor circuit of FIG. 16.

In FIG. 17, which is a detailed circuit diagram of the switched capacitor circuit 3C-i of FIG. 16, the switched capacitor circuit 3C-i is constructed by a switch circuit 301C formed by switches SW1(i), SW2(i), SW4(i) and SW6(i), a switch circuit 302C formed by switches SW2'(i), SW3(i), SW5(i) and SW6'(i), and a capacitor C(i).

In FIG. 17, the switches SW1(i) and SW3(i) correspond to the switches SWP1(i) and SWP3(i) of FIG. 12. Also, the switches SW2(i) and SW2'(i) correspond to the switches SWP2(i) and SWN2(i) of FIG. 12; however, the switches SW2(i) and SW2'(i) are controlled by the clock signals $\phi_2 \cdot D(i) \cdot S$ and $\phi_2 \cdot D(i) \cdot /S$, respectively. Further, the switches SW4(i) and SW5(i) correspond to the switches SWP4(i) and SWP5(i), respectively, of FIG. 12. Additionally, the switches SW6(i) and SW6'(i) correspond to the switches SWP6(i) and SWN6(i) of FIG. 12.

Even in the switched capacitor circuit 3C-i, the capacitor C(i) is charged by the switch SW1(i) as well as the switch SW3(i), so that a charge of Q is stored in the capacitor C(i) on the power supply side. Then, the capacitor C(i) is discharged by the switches SW2(i) and SW5(i) or the switches SW2'(i) and SW4(i) as well as the switches SW6(i) and SW6'(i) so that the charge of Q is discharged from the capacitor C to the output terminal OUT(i) or the power supply terminal $V_{COM}$. Thus, since the capacitor C(i) is in a floating state with no charge before the next charging operation, the load of the reference voltage generating circuit 2 is definite regardless of the sign signal S and the data signal D(i). Therefore, the settling error is not dependent upon the sign signal S and the data signal D(i), which would not degrade the total harmonic distortion (THD) characteristics and the signal-to-noise (S/N)-characteristics.

In FIG. 17, note that, if the sign signal S is unnecessary, the switches SW2'(i) and SW4(i) are deleted.

Figure 18:
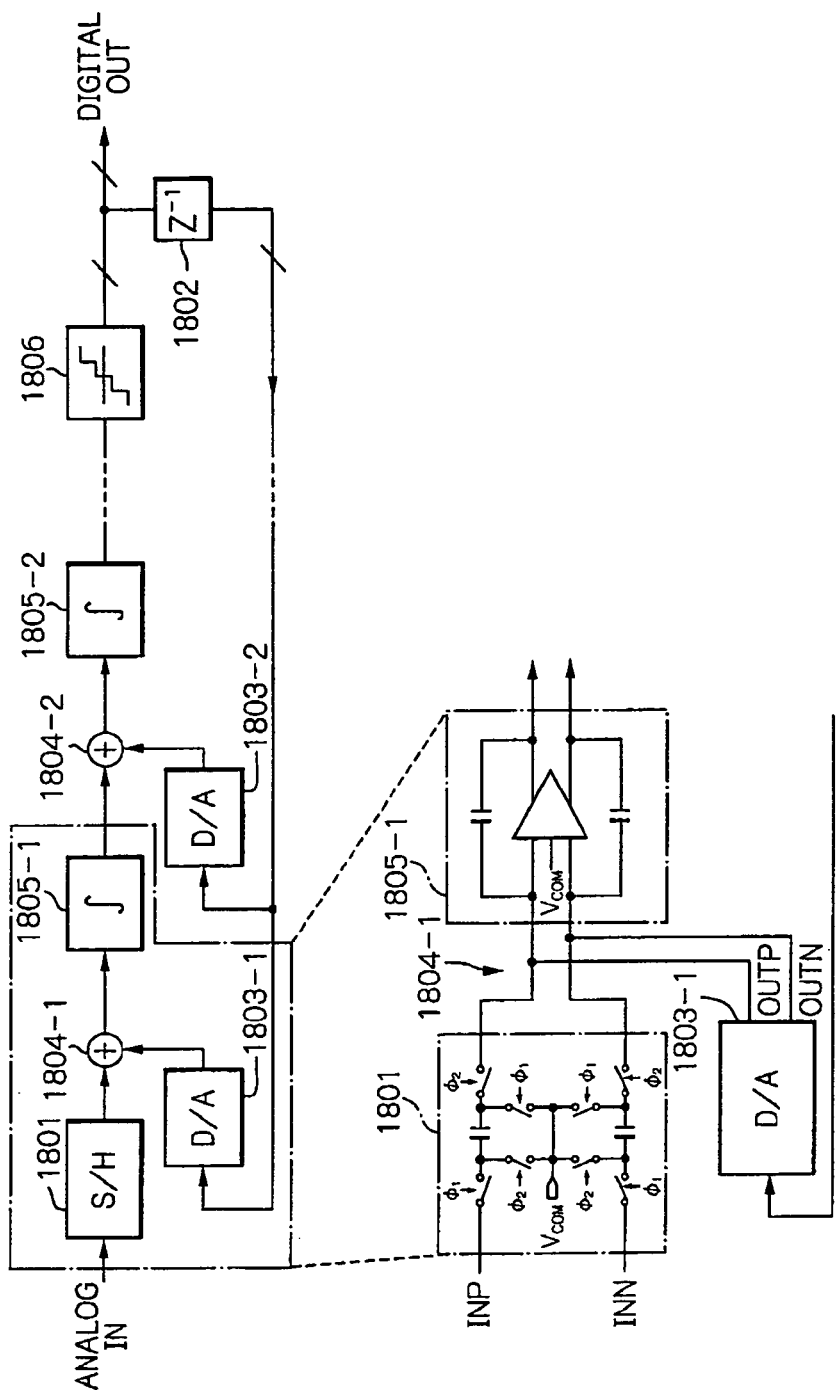
FIG. 18 is a block circuit diagram illustrating a multi-bit $\Delta\Sigma$ A/D converter to which the D/A converters of FIGS. 11, 14 and 16 are applied.

In FIG. 18, which illustrates a multi-bit $\Delta\Sigma$ A/D converter, reference numeral 1801 designates a sample/hold circuit formed by a switched capacitor circuit for receiving an analog input signal IN, 1802 designates a digital delay element for delaying a digital output signal OUT by a sampling time, 1803-1 designates a multi-level D/A converter, 1804-1 designates an analog adder for calculating a difference between the output signal of the sample/hold circuit 1801 and the D/A converter 1803-1, 1805-1 designates an analog integrator for integrating the output signal of the adder 1804-1, and 1806 designates a multi-bit quantizer. If the order of the multi-bit $\Delta\Sigma$ A/D converter of FIG. 18 is two, a multi-level D/A converter 1803-2, an analog adder 1804-2 and an analog integrator 1805-2 are added between the analog integrator 1805-1 and the multi-bit quantizer 1806.

The multi-level D/A converter of FIG. 11, 14 or 16 can be applied to the multi-level D/A converters 1803-1, 1803-2, ....

Figure 19:
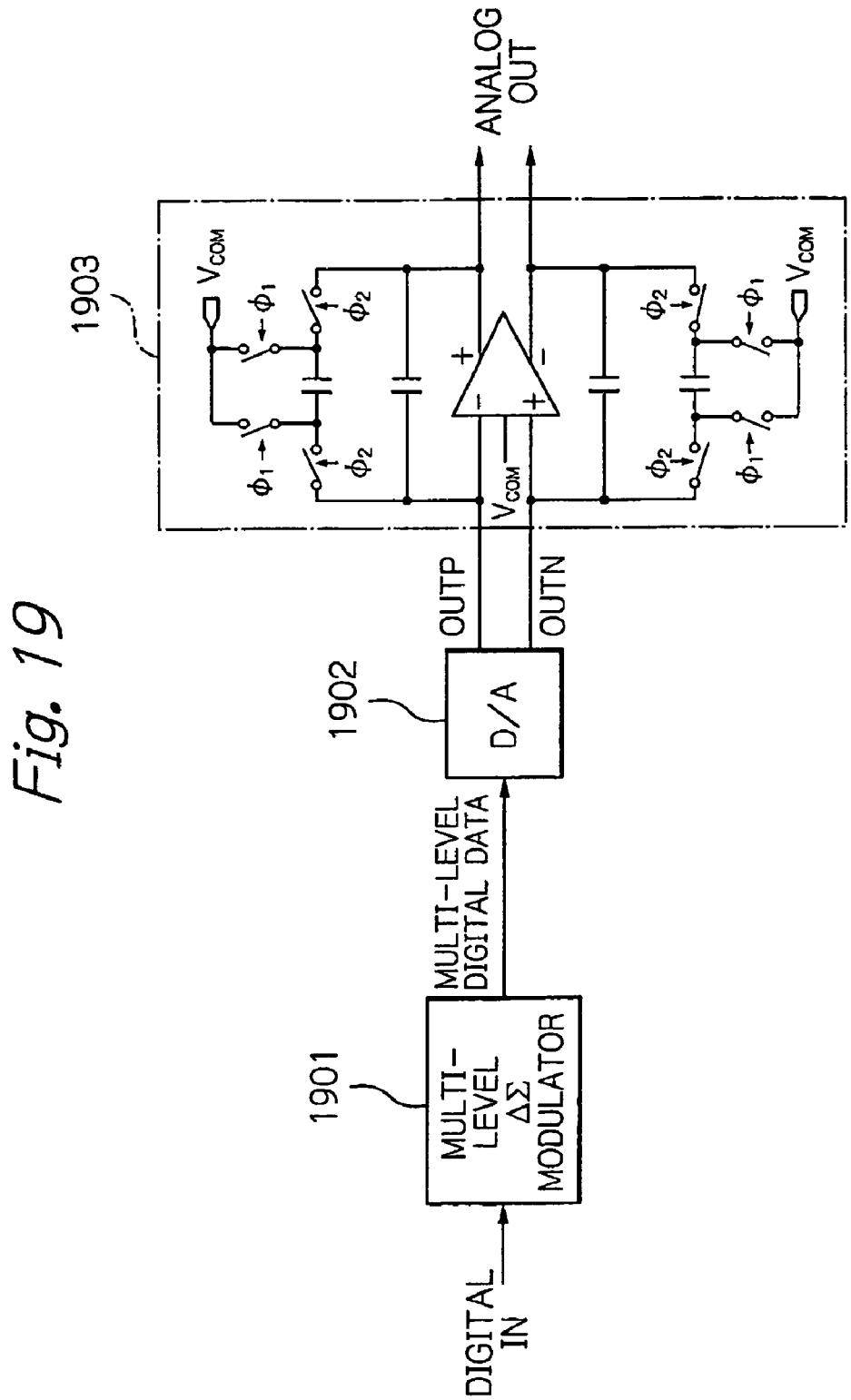
FIG. 19 is a block circuit diagram illustrating a multi-bit D/A converter to which the D/A converters of FIGS. 11, 14 and 16 are applied.

In FIG. 19, which illustrates a multi-bit $\Delta\Sigma$ D/A converter, reference numeral 1901 designates a multi-level $\Delta\Sigma$ modulator for receiving a digital input signal IN to generate a multi-level digital data, 1902 designates a multi-level D/A converter for converting the multi-level digital data of the multi-level $\Delta\Sigma$ modulator into an analog signal, and 1903 designates an active filter for smoothing the output signals of the multi-level D/A converter 1902 to generate an analog output signal OUT.

The multi-level D/A converter of FIG. 11, 14 or 16 can be applied to the multi-level D/A converter 1902.

In FIGS. 11, 14 and 16, although the capacitances of the capacitors CP(i) (CN(i)) and C(i) are the same in the switched capacitor circuits 3A-1, 3A-2, ..., 3A-n, 3B-1, 3B-2, ..., 3B-n and 3C-1, 3C-2, ..., 3C-n, these capacitances can be weighted such that $C_0$, $C_0/2$, ..., $C_0/2^n$.

The invention claimed is:

1. A digital/analog converter of a switched capacitor circuit type, comprising:
   at least one capacitor;
   at least one power supply terminal;
   at least one output terminal;
   a switch circuit adapted to carry out a charging operation upon said capacitor so that a charge is stored in said capacitor and then carry out a discharging operation upon said capacitor to selectively discharge said charge to one of said power supply terminal and said output terminal in accordance with a digital input data signal,
   wherein said switch circuit is further adapted to make said capacitor have no charge after said discharging operation is carried out.

2. The digital/analog converter as set forth in claim 1, wherein said switch circuit is further adapted to make said capacitor in a floating state with no charge after said discharging operation is carried out.

3. The digital/analog converter as set forth in claim 1, wherein said switch circuit is further adapted to repeat said charging and discharging operations to convert said digital input data signal successively into analog signals.

4. The digital/analog converter as set forth in claim 1, being incorporated into a multi-level digital/analog converter.

5. The digital/analog converter as set forth in claim 1, being incorporated into a digital/analog converter section of a multi-bit $\Delta\Sigma$ analog/digital converter.

6. The digital/analog converter as set forth in claim 1, being incorporated into a multi-level digital/analog converter section of a multi-bit digital/analog converter.

7. A digital/analog converter of a switched capacitor circuit type, comprising:
   a first power supply terminal adapted to receive a first power supply voltage;
   a second power supply terminal adapted to receive a second power supply voltage lower than said first power supply voltage;
   a third power supply terminal adapted to receive a third power supply voltage lower than said second power supply voltage;
   first and second output terminals;
   a first capacitor having first and second terminals;
   a second capacitor having third and fourth terminals;

a first switch circuit adapted to connect the first terminal of said first capacitor to said first power supply terminal in response to a first clock signal and to said second power supply terminal in response to a second clock signal;

a second switch circuit adapted to connect the third terminal of said second capacitor to said third power supply terminal in response to said first clock signal and to said second output terminal in response to said second clock signal;

a third switch circuit adapted to connect the second terminal of said first capacitor to said second power supply terminal in response to said first clock signal, to said first output terminal in response to said second clock signal when a digital input signal indicates a first value, to said second power supply terminal in response to said second clock signal when said digital input signal indicates a second value, and to said second power supply terminal in response to said second clock signal when said digital input signal indicates a third value; and a fourth switch circuit adapted to connect the fourth terminal of said second capacitor to said second power supply terminal in response to said first clock signal, to said second output terminal in response to said second clock signal when said digital input signal indicates said first value, to said first output terminal in response to said second clock signal when said digital input signal indicates said second value, and to said second power supply terminal when said digital input signal indicates said third value.

8. The digital/analog converter as set forth in claim 7, being incorporated into a multi-level digital/analog converter.

9. The digital/analog converter as set forth in claim 7, being incorporated into a digital/analog converter section of a multi-bit ΔΣ analog/digital converter.

10. The digital/analog converter as set forth in claim 7, being incorporated into a multi-level digital/analog converter section of a multi-bit digital/analog converter.

11. A digital/analog converter of a switched capacitor circuit type, comprising:

a first power supply terminal adapted to receive a first power supply voltage;

a second power supply terminal adapted to receive a second power supply voltage lower than said first power supply voltage;

a third power supply terminal adapted to receive a third power supply voltage lower than said second power supply voltage;

an output terminal;

a capacitor having first and second terminals;

a first switch circuit adapted to connect the first terminal of said capacitor to said first power supply terminal in response to a first clock signal when a digital input signal indicates a first value, to said third power supply terminal in response to said first clock signal when said digital input signal indicates a second value, and to said second power supply terminal in response to a second clock signal; and a second switch circuit adapted to connect the second terminal of said capacitor to said second power supply terminal in response to said first clock signal, to said output terminal in response to said second clock signal when said digital input signal indicates a third value, and to said second power supply terminal in response to said second clock signal when said digital input signal indicates a fourth value.

12. The digital/analog converter as set forth in claim 11, being incorporated into a multi-level digital/analog converter.

13. The digital/analog converter as set forth in claim 11, being incorporated into a digital/analog converter section of a multi-bit ΔΣ analog/digital converter.

14. The digital/analog converter as set forth in claim 11, being incorporated into a multi-level digital/analog converter section of a multi-bit digital/analog converter.

15. A digital/analog converter comprising:

a first power supply terminal adapted to receive a first power supply voltage;

a second power supply terminal adapted to receive a second power supply voltage lower than said first power supply voltage;

an output terminal;

a capacitor having first and second terminals;

a first switch circuit adapted to connect the first terminal of said capacitor to said first power supply terminal in response to a first clock signal, to said second power supply terminal in response to a second clock signal when a digital input signal indicates a first value, to said output terminal in response to said second clock signal when said digital input signal indicates a second value, and to said second power supply terminal in response to said second clock signal when said digital input signal indicates a third value; and a second switch circuit adapted to connect the second terminal of said capacitor to said second power supply terminal in response to said first clock signal, to said output terminal in response to said second clock signal when said digital input signal indicates a first value, and to said second power supply terminal in response to said second clock signal when said digital input signal indicates said second value or a third value.

16. The digital/analog converter as set forth in claim 15, being incorporated into a multi-level digital/analog converter.

17. The digital/analog converter as set forth in claim 15, being incorporated into a digital/analog converter section of a multi-bit ΔΣ analog/digital converter.

18. The digital/analog converter as set forth in claim 15, being incorporated into a multi-level digital/analog converter section of a multi-bit digital/analog converter.

19. A digital/analog converter of a switched capacitor circuit type, adapted to receive a digital signal and to output an analog signal corresponding to said digital signal, comprising:

a first power supply terminal adapted to receive a first power supply voltage;

a second power supply terminal adapted to receive a second power supply voltage different from said first power supply voltage;

a capacitor;

a first switch circuit adapted to connect one terminal of said capacitor to said first power supply terminal in response to a first clock signal and to said second power supply terminal in response to a second clock signal; and a second switch circuit adapted to connect another terminal of said capacitor to said second power supply terminal in response to said first clock signal and to select one of said second power supply terminal and an output terminal in accordance with a value of said digital signal in response to said second clock signal.

* * * * *